United States Patent
Ohno et al.

(10) Patent No.: US 11,232,882 B2
(45) Date of Patent: Jan. 25, 2022

(54) DISPERSING ELEMENT, METHOD FOR MANUFACTURING STRUCTURE WITH CONDUCTIVE PATTERN USING THE SAME, AND STRUCTURE WITH CONDUCTIVE PATTERN

(71) Applicant: Asahi Kasei Kabushiki Kaisha, Tokyo (JP)

(72) Inventors: Eiichi Ohno, Tokyo (JP); Toru Yumoto, Tokyo (JP); Masanori Tsuruta, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/491,115

(22) PCT Filed: Mar. 15, 2018

(86) PCT No.: PCT/JP2018/010287
§ 371 (c)(1),
(2) Date: Sep. 4, 2019

(87) PCT Pub. No.: WO2018/169012
PCT Pub. Date: Sep. 20, 2018

(65) Prior Publication Data
US 2020/0013521 A1    Jan. 9, 2020

(30) Foreign Application Priority Data

Mar. 16, 2017   (JP) .............................. JP2017-051568
Mar. 16, 2017   (JP) .............................. JP2017-051569
(Continued)

(51) Int. Cl.
*H05K 1/09*      (2006.01)
*H01B 1/22*      (2006.01)
(Continued)

(52) U.S. Cl.
CPC ............. *H01B 1/22* (2013.01); *H01B 13/008* (2013.01); *H05K 1/09* (2013.01); *H05K 1/092* (2013.01);
(Continued)

(58) Field of Classification Search
CPC ................................ H05K 1/09; H05K 1/092
See application file for complete search history.

(56) References Cited

U.S. PATENT DOCUMENTS 4,868,034 A        9/1989   Steinberg
2004/0185388 A1    9/2004   Hirai
(Continued)

FOREIGN PATENT DOCUMENTS

CN      102137728 A     7/2011
CN      102585602 A     7/2012
(Continued)

OTHER PUBLICATIONS

Machine Translation of WO2014119498, Fujifilm Corporation, Aug. 2014 (Year: 2014).*
(Continued)

*Primary Examiner* — Jeremy C Norris
(74) *Attorney, Agent, or Firm* — Morgan, Lewis & Bockius LLP

(57) ABSTRACT

A conductive pattern having high dispersion stability and a low resistance over a board is formed. A dispersing element (1) contains a copper oxide (2), a dispersing agent (3), and a reductant. Content of the reductant is in a range of a following formula (1). Content of the dispersing agent is in a range of a following formula (2).

$0.0001 \leq (\text{reductant mass/copper oxide mass}) \leq 0.10$ (1)

$0.0050 \leq (\text{dispersing agent mass/copper oxide mass}) \leq 0.30$ (2)

(Continued)

The dispersing element containing the reductant promotes reduction of copper oxide to copper in firing and promotes sintering of the copper.

18 Claims, 7 Drawing Sheets

(30) Foreign Application Priority Data

| Mar. 16, 2017 | (JP) | JP2017-051570 |
|---|---|---|
| Mar. 16, 2017 | (JP) | JP2017-051571 |
| Mar. 16, 2017 | (JP) | JP2017-051572 |
| Jul. 27, 2017 | (JP) | JP2017-0145188 |
| Feb. 13, 2018 | (JP) | JP2018-023239 |
| Feb. 13, 2018 | (JP) | JP2018-023242 |

(51) Int. Cl.
 *H01B 13/008* (2006.01)
 *H05K 3/12* (2006.01)

(52) U.S. Cl.
 CPC ... *H05K 3/1291* (2013.01); *H05K 2203/0117* (2013.01)

(56) References Cited

U.S. PATENT DOCUMENTS

| 2004/0211979 | A1 | 10/2004 | Shioiri et al. |
| 2005/0069648 | A1 | 3/2005 | Maruyama |
| 2005/0189136 | A1 | 9/2005 | Kawasaki et al. |
| 2008/0166502 | A1 | 7/2008 | Nakamae |
| 2009/0181184 | A1 | 7/2009 | Pope et al. |
| 2009/0258202 | A1 | 10/2009 | Sakaguchi et al. |
| 2011/0155432 | A1 | 6/2011 | Tomonari et al. |
| 2012/0267151 | A1 | 10/2012 | Hojo et al. |
| 2014/0065387 | A1 | 3/2014 | Andre et al. |
| 2014/0367619 | A1 | 12/2014 | Summers |
| 2014/0370310 | A1 | 12/2014 | Kawato et al. |
| 2014/0377457 | A1 | 12/2014 | Liu et al. |
| 2015/0116895 | A1 | 4/2015 | Yoo et al. |
| 2016/0024316 | A1 | 1/2016 | Sasada et al. |
| 2016/0024317 | A1* | 1/2016 | Hayata ............ C09D 5/24 427/126.3 |
| 2016/0086688 | A1 | 3/2016 | Hongo et al. |
| 2016/0155814 | A1 | 6/2016 | Ogawa et al. |
| 2017/0118836 | A1 | 4/2017 | Kim et al. |
| 2017/0140847 | A1* | 5/2017 | Kamikoriyama ........ C08K 3/08 |
| 2018/0171159 | A1 | 6/2018 | Ooi et al. |

FOREIGN PATENT DOCUMENTS

| CN | 104588643 A | 5/2015 |
| EP | 0316886 A2 | 5/1989 |
| EP | 2738772 A1 | 6/2014 |
| EP | 2785158 A1 | 10/2014 |
| EP | 3127969 A1 | 2/2017 |
| JP | S63-081706 A | 4/1988 |
| JP | S63-081997 A | 4/1988 |
| JP | H01-129492 A | 5/1989 |
| JP | H01-220303 A | 9/1989 |
| JP | H02-174145 A | 7/1990 |
| JP | H03-008209 A | 1/1991 |
| JP | H05-041575 A | 2/1993 |
| JP | H07-014427 A | 1/1995 |
| JP | H10-188671 A | 7/1998 |
| JP | H11-016419 A | 1/1999 |
| JP | 2004-119686 A | 4/2004 |
| JP | 2004-253794 A | 9/2004 |
| JP | 2004-327703 A | 11/2004 |
| JP | 2005-71805 A | 3/2005 |
| JP | 2007-080720 A | 3/2007 |
| JP | 2008-193067 A | 8/2008 |
| JP | 2009-283547 A | 12/2009 |
| JP | 2011-086717 A | 4/2011 |
| JP | 2011-252202 A | 12/2011 |
| JP | 2012-142318 A | 7/2012 |
| JP | 2013-004309 A | 1/2013 |
| JP | 2013-104089 A | 5/2013 |
| JP | 2013-115004 A | 6/2013 |
| JP | 2014-500375 A | 1/2014 |
| JP | 2014-041969 A | 3/2014 |
| JP | WO2014119498 * | 8/2014 |
| JP | 2015-008136 A | 1/2015 |
| JP | 2015-018674 A | 1/2015 |
| JP | 2015-018675 A | 1/2015 |
| JP | 2015-046369 A | 3/2015 |
| JP | 2015-210973 A | 11/2015 |
| JP | 2016-014181 A | 1/2016 |
| JP | 2016-527665 A | 9/2016 |
| JP | 2016-176146 A | 10/2016 |
| WO | 03/051562 A1 | 6/2003 |
| WO | 2014/119498 A1 | 8/2014 |
| WO | 2015/012264 A1 | 1/2015 |
| WO | 2016/195047 A1 | 12/2016 |

OTHER PUBLICATIONS

International Search Report issued in corresponding International Patent Application No. PCT/JP2018/010287 dated Jun. 12, 2018.
Supplementary European Search Report issued in corresponding European Patent Application No. 18767041.9 dated Dec. 16, 2020.
Extended European Search Report issued in related European Patent Application No. 21187184.3 dated Oct. 28, 2021.
Uha et al., "Solution phase synthesis and intense pulsed light sintering and reduction of a copper oxide ink with an encapsulating nickel oxide barrier," Nanotechnology (26): 175601 (2015).

* cited by examiner

DISPERSING ELEMENT, METHOD FOR MANUFACTURING STRUCTURE WITH CONDUCTIVE PATTERN USING THE SAME, AND STRUCTURE WITH CONDUCTIVE PATTERN

TECHNICAL FIELD

The present invention relates to a dispersing element, a method for manufacturing a structure with a conductive pattern using the same, and the structure with the conductive pattern.

BACKGROUND ART

A circuit board has a structure where conductive wiring is wired on a board. A method for manufacturing the circuit board is typically as follows. First, a photoresist is applied over a board with a stuck metal foil. Next, the photoresist is exposed and developed to obtain a negative appearance of a desired circuit pattern. Next, a part of the metal foil not coated with the photoresist is removed by chemical etching to form a pattern. Thus, high-performance circuit boards can be manufactured.

However, the conventional method has drawbacks, such as a large number of steps, complicated processing, and the necessity of a photoresist material.

In contrast to this, a direct wiring printing technique (hereinafter referred to as printed electronics (PE) method) that directly prints a desired wiring pattern on a board with a dispersing element, produced by dispersing microparticles selected from the group consisting of metal microparticles and metal oxide microparticles has been drawing attention. For example, since the number of steps is small and the use of the photoresist material is unnecessary, this technique features significantly high productivity.

The dispersing element includes metal ink and metal paste. The metal ink is a dispersing element produced by dispersing ultrafine metal particles having an average particle diameter of several to several tens of nanometers into a dispersion medium. When the metal ink is applied over the board and dried, and then a heat treatment is performed on this metal ink, by lowering of a melting point specific to the ultrafine metal particles, the metal ink sinters at a temperature lower than a melting point of the metal, thus ensuring forming a metal film having a conductive property (hereinafter also referred to as conductive film). The metal film obtained using the metal ink has a thin film thickness, close to the metal foil.

Meanwhile, the metal paste is a dispersing element produced by dispersing microparticles of metal having a micrometer size into a dispersion medium together with binder resin. Since the size of the microparticles is large, to prevent precipitation, the metal paste is usually supplied in a state of considerably high viscosity. Therefore, the metal paste is suitable for screen-printing and an application with a dispenser appropriate for a material with high viscosity. Since metal particles of the metal paste have a large size, the metal paste has a feature of ensuring formation of a metal film having a thick film thickness.

As metal used for such metal particles, copper has been drawing attention. Especially, as a substitution of indium tin oxide (ITO), which has been widely used as an electrode material of a projected capacitive touchscreen, copper is the most promising from perspectives of resistivity, an ion (electrochemical) migration, results as a conductor, a price, a reserve, and the like.

However, the copper in the form of ultrafine particles of several tens of nanometers is likely to oxidize and therefore an antioxidant treatment is required. The antioxidant treatment had a problem of hindering sintering.

To solve such problem, there has been proposed the following. Using ultrafine particles of copper oxide as a precursor, the copper oxide is reduced to copper under an appropriate atmosphere by energy, such as heat and active ray to form a copper thin film (for example, see Patent Document 1).

A surface diffusion itself in the ultrafine particles of the copper oxide occurs at a temperature lower than 300° C. Accordingly, when the copper oxide is reduced to the copper under the appropriate atmosphere by energy, the superparticles of the copper mutually form fine random chains through sintering and are entirely shaped like a network, thus ensuring obtaining a desired electrical conductivity.
Patent Document 1: WO 2003/051562 A

DISCLOSURE OF THE INVENTION

Problems to be Solved by the Invention

As a first problem, the metal thin film obtained by the PE method using the metal ink and the metal paste has been requested that a change over time is small in addition to low resistivity. For example, regarding a silver paste, it has been known that since silver is likely to oxidize under the atmosphere and the oxidization increases the resistivity, resistivity between silver particles worsens over time.

However, there are no citations that examined on the stability of resistivity of the metal film obtained by the PE method using the ultrafine particles of the copper oxide disclosed in Patent Document 1 as the precursor.

For industrial use, the dispersing element is also requested to have excellent dispersion stability against the change over time in high concentration.

As a second problem, it has been known that, in the conventional PE method using the metal paste, which metalizes microparticles of metal oxide by reduction to obtain a metal film, sintering is likely to proceed as the particle diameter becomes small, cracks occur during a firing process, and the resistivity is likely increase. The sintering fuses the plurality of microparticles in contact by the interfaces, and the microparticles mutually take in the others and grow up to be large particles. A decrease in surface areas of the particles proceeds then, and clearances present between the plurality of microparticles disappear. Consequently, a volume of the application film contracts and this possibly causes cracks. The crack involves an increase in resistivity of the metal film.

It has been known that when the thickness of the application film of the metal paste becomes larger than 1 µm, cracks are likely to occur in the firing process and also cracks occur over time and the resistivity of the metal film worsens over time.

However, there are no citations that examined on the stability of resistivity over time, especially cracks generated over time, of the metal film obtained by the PE method using the ultrafine particles of the copper oxide disclosed in Patent Document 1 as the precursor.

Further, it has been requested that the dispersing element used for the PE method is also applicable to the screen-printing that can obtain an application film having a comparatively thick film, in addition to ink-jet printing that can obtain an application film having a comparatively thin film.

Additionally, the metal film is requested to be easily soldered. For example, a typical, general-purpose conductive paste is electrically conducted by physical contact of metal particles (average particle diameter: 0.5 to 2.0 μm) a hardening shrinkage of a binder resin. In view of this, the binder resin exudes to the surface of the metal film and forms a film, making the soldering difficult. The metal film is also requested to have high adhesiveness with a solder.

The present invention has been made in consideration of the points, and one object of the present invention is to provide a dispersing element that features high dispersion stability and can form a conductive pattern having a low resistance on a board, a method for manufacturing a structure with the conductive pattern using the dispersing element, and the structure with the conductive pattern.

Additionally, one object is to provide the dispersing element applicable to a screen-printing method and that can obtain the conductive pattern excellent in stability of resistivity over time and a soldering performance, the method for manufacturing the structure with the conductive pattern using the dispersing element, and the structure with the conductive pattern.

Solutions to the Problems

As a result of diligent studies to solve the above-described problems, the inventors have completed the present invention. The present invention is to solve any one of the first and the second problems.

That is, a dispersing element according to one aspect of the present invention contains a copper oxide, a dispersing agent, and a reductant. Content of the reductant is in a range of a following formula (1). Content of the dispersing agent is in a range of a following formula (2).

$$0.0001 \leq (\text{reductant mass/copper oxide mass}) \leq 0.10 \quad (1)$$

$$0.0050 \leq (\text{dispersing agent mass/copper oxide mass}) \leq 0.30 \quad (2)$$

The ranges of the masses of the reductant and the dispersing agent to that of the copper oxide are limited in this structure. Accordingly, dispersion stability is improved and a resistance of a conductive pattern effectively decreases. Additionally, since a firing process can be performed using plasma, light, and laser light, an organic matter in the copper oxide is decomposed, the firing of the copper oxide is promoted, and the conductive pattern having the low resistance can be formed.

A dispersing element according to one aspect of the present invention contains a copper oxide having a particle diameter of 1 nm or more to 50 nm or less, copper particles having particle diameters of 0.1 μm or more to 100 μm or less, and an organic compound having a phosphate group.

With this structure, sintering an application film using the dispersing element containing the copper particles having the particle diameters of the micrometer order and the copper oxide particles of the nanometer order by the firing process bonds the copper particles together and forms a firm mechanical structure. At the same time, the copper oxide particles present between the copper particles are reduced by the firing process, change into metal copper and sinter, and are integrated with the copper particles, thus generating an electrical conduction. A mechanical strength and the electrical conduction of the conductive pattern are improved and the stability of resistivity over time increases. Additionally, aggregation is less likely to occur and therefore dispersion stability is excellent and the screen-printing becomes possible.

A dispersing element according to one aspect of the present invention contains a copper oxide and at least one kind of copper particles having shapes extending in one direction, dendritic shapes, or flat shapes.

With this structure, the copper particles having the shapes of extending in one direction, the dendritic shapes, or the flat shapes easily align, and many contact points between the particles can be ensured. At the same time, since the reduced copper oxide particles act as a binder, the mechanical strength and the electrical conduction of the conductive pattern are improved and the stability of resistivity over time increases. Additionally, the aggregation is less likely to occur and therefore the dispersion stability is excellent and the screen-printing becomes possible.

The dispersing element according to one aspect of the present invention is preferably as follows. The dispersing element contains copper particles. The copper particles have shapes extending in one direction, dendritic shapes, or flat shapes.

The dispersing element according to one aspect of the present invention preferably contains at least the copper particles having the dendritic shapes.

In the dispersing element according to one aspect of the present invention, the copper oxide preferably has a particle diameter of 1 nm or more to 50 nm or less.

In the dispersing element according to one aspect of the present invention, the copper particles preferably have a mass ratio to a mass of the copper oxide of 1.0 or more to 7.0 or less.

In the dispersing element according to one aspect of the present invention, the organic compound has a mass ratio to a mass of the copper oxide of 0.0050 or more to 0.30 or less.

The dispersing element according to one aspect of the present invention is preferably as follows. The dispersing element contains a reductant. The reductant has a mass ratio to a mass of the copper oxide of 0.0001 or more to 0.10 or less.

The dispersing element according to one aspect of the present invention is preferably as follows. The dispersing element contains a reductant. The reductant contains at least one kind selected from the group consisting of a hydrazine, a hydrazine hydrate, a sodium, a carbon, a potassium iodide, an oxalic acid, an iron sulfide (II), a sodium thiosulfate, an ascorbic acid, a tin chloride (II), a diisobutylaluminium hydride, a formic acid, a sodium borohydride, and a sulfite.

In the dispersing element according to one aspect of the present invention, the copper oxide preferably contains a cuprous oxide.

The dispersing element according to one aspect of the present invention is preferably as follows. The dispersing element further contains a dispersion medium. The dispersion medium is at least one kind selected from the group consisting of a terpineol, a γ-butyrolactone, a cyclohexanone, an ethanol, a propylene glycol, a butanol, a propanol, an ethylene glycol monoethyl ether acetate, and a tetralin.

The dispersing element according to one aspect of the present invention is preferably as follows. The dispersing element further contains a dispersion medium. Two or more kinds of the dispersion mediums are contained.

A method for manufacturing a structure with a conductive pattern according to one aspect of the present invention includes: a step of applying the dispersing element over a board to form an application film; and a step of irradiating the application film with laser light to form a conductive pattern on the board.

A method for manufacturing a structure with a conductive pattern according to one aspect of the present invention includes: a step of applying the dispersing element over a board in a desired pattern to form an application film; and a step of performing a firing process on the application film to form a conductive pattern on the board.

In the method for manufacturing the structure with the conductive pattern according to one aspect of the present invention, the firing process is preferably performed by generating plasma under an atmosphere containing a reducing gas.

In the method for manufacturing the structure with the conductive pattern according to one aspect of the present invention, the firing process is preferably performed by a light irradiation method.

In the method for manufacturing the structure with the conductive pattern according to one aspect of the present invention, the firing process is preferably performed by heating the application film with heat at 100° C. or more.

In the method for manufacturing the structure with the conductive pattern according to one aspect of the present invention, the dispersing element is preferably applied by an aerosol method to form the desired pattern.

In the method for manufacturing the structure with the conductive pattern according to one aspect of the present invention, the dispersing element is preferably applied by screen-printing.

In the method for manufacturing the structure with the conductive pattern according to one aspect of the present invention, after the application film is formed on a transfer body, the application film is preferably transferred from the transfer body to the board to form the application film on the board.

The method for manufacturing the structure with the conductive pattern according to one aspect of the present invention preferably includes: a step of applying the dispersing element over a transfer body and then contacting a convex portion with the transfer body and removing an unnecessary dispersing element to form a desired pattern on a surface of the transfer body; and a step of contacting the board with the surface of the transfer body to transfer the desired pattern to the board.

In the method for manufacturing the structure with the conductive pattern according to one aspect of the present invention, the conductive pattern is preferably an antenna.

In the method for manufacturing the structure with the conductive pattern according to one aspect of the present invention, the conductive pattern preferably has a mesh shape.

The method for manufacturing the structure with the conductive pattern according to one aspect of the present invention preferably further includes a step of forming a solder layer on a part of a surface of the conductive pattern.

In the method for manufacturing the structure with the conductive pattern according to one aspect of the present invention, on the conductive pattern, an electronic component is preferably soldered via the solder layer by a reflow method.

A structure with a conductive pattern according to one aspect of the present invention includes a board, a cuprous-oxide-containing layer, and a conductive layer. The cuprous-oxide-containing layer is formed on a surface of the board. The conductive layer is formed on a surface of the cuprous-oxide-containing layer. The conductive layer is a wiring having a wire width of 1 μm or more to 1000 μm or less. The wiring contains a reduced copper.

A structure with a conductive pattern according to one aspect of the present invention includes a board, a cuprous-oxide-containing layer, and a conductive layer. The cuprous-oxide-containing layer is formed on a surface of the board. The conductive layer is formed on a surface of the cuprous-oxide-containing layer. The conductive layer is a wiring having a wire width of 1 μm or more to 1000 μm or less. The wiring contains a reduced copper, a copper, and a tin.

A structure with a conductive pattern according to one aspect of the present invention includes a board and a conductive pattern. The conductive pattern is formed on a surface of the board. The conductive pattern is a wiring having a wire width of 1 μm or more to 1000 μm or less. The wiring contains a reduced copper, a phosphorus, and a void.

A structure with a conductive pattern according to one aspect of the present invention includes a board and a conductive pattern. The conductive pattern is formed on a surface of the board. The conductive pattern is a wiring having a wire width of 1 μm or more to 1000 μm or less. The wiring contains a reduced copper, a copper, and a tin.

In the structure with the conductive pattern according to one aspect of the present invention, the copper preferably has a grain size of 0.1 μm or more to 100 μm or less.

In the structure with the conductive pattern according to one aspect of the present invention, the conductive layer or the conductive pattern preferably has a surface having a surface roughness of 500 nm or more to 4000 nm or less.

In the structure with the conductive pattern according to one aspect of the present invention, the wiring is preferably usable as an antenna.

In the structure with the conductive pattern according to one aspect of the present invention, the conductive layer or the conductive pattern preferably has a surface on which a solder layer is partially formed.

A structure with a conductive pattern according to one aspect of the present invention includes a board and a conductive pattern. The conductive pattern is formed on the board surface. The conductive pattern is a wiring having a wire width of 1 μm or more to 1000 μm or less. The wiring contains a reduced copper, a copper oxide, and a phosphorus. A resin is disposed so as to cover the wiring.

Effects of the Invention

According to the present invention, the conductive pattern featuring the high dispersion stability and the low resistance on the board can be formed.

Additionally, the conductive pattern applicable to the screen-printing method and excellent in stability of resistivity over time and a soldering performance can be obtained.

DESCRIPTION OF PREFERRED EMBODIMENTS

Figure 1:
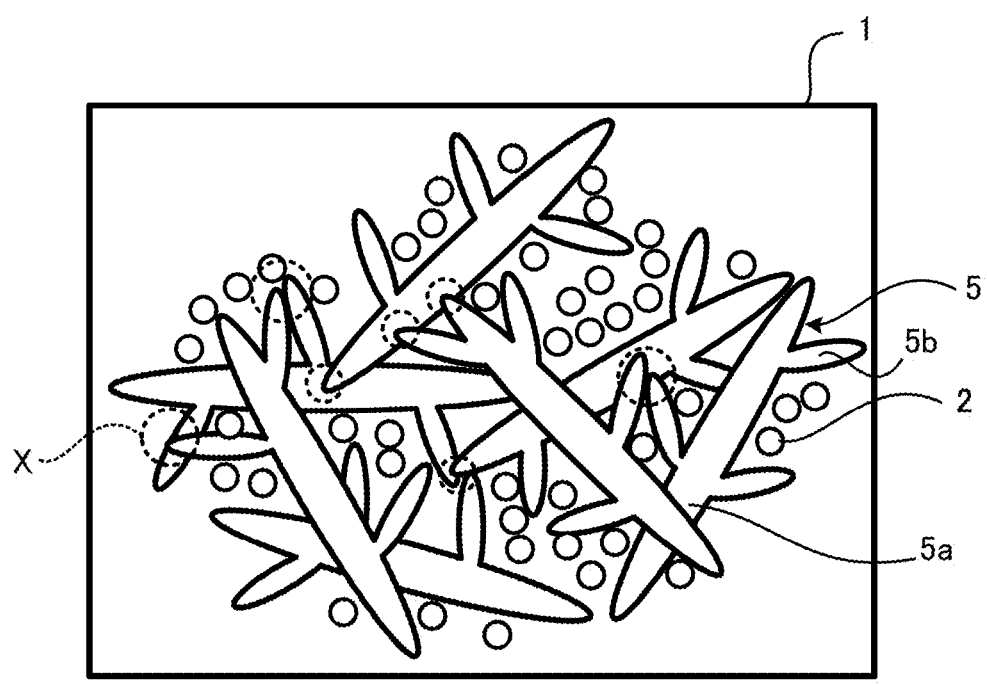
FIG. 1 is a schematic diagram illustrating states of copper oxide and copper particles having dendritic shapes before a dispersing element according to a third embodiment is applied over a board and a firing process is performed.

While the following exemplarily describes embodiments of the present invention (hereinafter referred to as "embodiments") in detail, the present invention is not limited to the embodiments.

First Embodiment

A dispersing element of the first embodiment contains (1) copper oxide, (2) dispersing agent, and (3) reductant. The dispersing element containing the reductant promotes reduction of copper oxide to copper in firing and promotes sintering of the copper.

The content of the reductant meets a range of the following formula (1). A mass ratio of the reductant of 0.0001 or more improves dispersion stability and decreases a resistance of a copper film. Additionally, the mass ratio of 0.1 or less improves long-term stability of the dispersing element.

$$0.0001 \leq (\text{reductant mass/copper oxide mass}) \leq 0.10 \quad (1)$$

The content of the dispersing agent meets a range of the following formula (2). This reduces aggregation of the copper oxide and improves the dispersion stability.

$$0.0050 \leq (\text{dispersing agent mass/copper oxide mass}) \leq 0.30 \quad (2)$$

The dispersing element of the first embodiment is limited in the ranges of the masses of the reductant and the dispersing agent to that of the copper oxide. Accordingly, the dispersion stability is improved and a resistance of a conductive film effectively decreases. Additionally, since the firing process can be performed using plasma, light, and laser light, an organic matter in the copper oxide is decomposed, the firing of the copper oxide is promoted, and the conductive film having the low resistance can be formed. In view of this, various copper wirings, such as an electromagnetic wave shield and a circuit, can be provided.

The dispersing element of the first embodiment contains the copper particles, and the copper particles preferably have shapes extending in one direction, dendritic shapes, or flat shapes. The dispersing element of the first embodiment more preferably at least contains the copper particles having the dendritic shapes. Accordingly, for example, compared with particles having spherical shapes or regular polyhedron shapes and having a small aspect ratio, the copper particles having the specific shapes are likely to get entangled with one another and align. In view of this, many contact points between the particles can be ensured, sintering the application film by the firing process forms a firm mechanical structure, and cracks are reduced in the obtained conductive film.

The dispersing element of the first embodiment contains the copper particles, and the copper particles preferably have particle diameters of 0.1 µm or more to 100 µm or less, further preferably 0.5 µm or more to 50 µm or less, and especially preferably 1.0 nm or more to 10 µm or less. Thus, a crack reducing effect is high, and the ultrafine particles of the nanometer order of the copper oxide enter between the copper particles and easily work as a binder. This also allows preventing the mechanical strengths of the copper particles themselves from decreasing.

The copper oxide in the dispersing element of the first embodiment preferably has the particle diameter of 1 nm or more to 50 nm or less. Thus, the sintering is facilitated and the copper oxide particles easily enter between the copper particles and therefore the copper oxide particles easily act as the binder. Moreover, usage of the dispersing agent can be reduced, making the firing process easy.

Thus, sintering the application film using the dispersing element containing the copper particles having the particle diameters of the micrometer order and the copper oxide particles of the nanometer order by the firing process bonds the copper particles together and forms the firm mechanical structure.

Second Embodiment

As a result of diligent examination, the inventors have found the following. The use of the copper oxide particles having specific particle diameters and the copper particles having specific particle diameters in combination for the dispersing element and the use of the dispersing agent reduce both cracks generated in sintering and cracks generated over time, thereby ensuring obtaining a conductive film having low resistivity and excellent stability of resistivity over time.

It has been found that although the above-described dispersing element contains the ultrafine particles in high concentration, the dispersing element is less likely to aggregate. Accordingly, it has been found that the dispersing element is also applicable to the screen-printing method and is excellent in printability. Moreover, it has been found that the above-described dispersing element exhibits excellent dispersion stability against a change over time in high concentration and allows screen-printing even after storage over a long period of time.

Furthermore, it has been found that the use of the screen-printing allows forming an application film having a comparatively thick film; therefore, the above-described dispersing element can conduct a large amount of current by the obtained conductive film.

A soldering performance to the conductive film with the use of the above-described dispersing element has been found to be satisfactory.

The inventors have completed the present invention based on such new viewpoints. That is, the dispersing element of the second embodiment contains the copper oxide having the particle diameter of 1 nm or more to 50 nm or less, the copper particles having the particle diameters of 0.1 µm or more to 100 µm or less, and an organic compound having a phosphate group.

Here, the particle diameter is an average particle diameter of primary particles of the copper oxide particles and the copper particles.

With the dispersing element according to the second embodiment, sintering the application film using the dispersing element containing the copper particles having the particle diameters of the micrometer order and the copper oxide particles of the nanometer order as described above by the firing process bonds the copper particles together, thus forming the firm mechanical structure. Since the copper oxide particles are present between the copper particles, the copper oxide particles are reduced by the firing process, change into the metal copper and sinter, and are integrated with the copper particles, thus generating electrical conduction. In other words, the copper oxide particles act as the binder to the copper particles. Accordingly, the obtained conductive film reduces cracks caused by sudden strain and residual strain during sintering. Additionally, the copper particles and the reduced copper oxide particles form a path as a conductor and ensure reducing the resistivity. As a result, the conductive film having the low resistivity and the high stability of resistivity over time can be obtained.

In the dispersing element according to the second embodiment, the particle diameters of the copper oxide particles have the upper limit value of 50 nm. The particle diameter of less than that facilitates the sintering and the copper oxide particles easily enter between the copper particles and therefore the copper oxide particles are likely to act as the binder.

With the copper oxide particles having such a size, lowering of a melting point specific to ultrafine metal particles causes the copper oxide particles to sinter at a temperature lower than the melting point of the metal, thereby ensuring forming the conductive film.

Note that designing the particle diameters of the metal particles to sufficiently decrease increases a proportion of high-energy atoms to all the atoms in the particle and a surface diffusion of the atoms increases to a level that cannot be ignored. As a result, caused by the surface diffusion, interfaces of the mutual particles are stretched, and sintering is performed at a temperature lower than the melting point of the metal, which is referred to as the lowering of melting point.

Meanwhile, the particle diameters of the copper oxide particles have the lower limit value of 1 nm. This is because that the particle diameter of more than that allows reducing the usage of the dispersing agent and facilitates the firing process.

The particle diameter is determined from perspectives of denseness and electrical property of the metal copper obtained by the reduction treatment of the copper oxide particles. Further, considering the use of a resin board, the firing condition needs to further lower the temperature from a perspective of reducing damage given to the board and therefore a further small particle diameter is preferred. With the primary particle diameter of 50 nm or less, there is a tendency that input energy can decrease such that the board is not damaged further by the condition in the firing process described later.

In the dispersing element according to the second embodiment, the particle diameters of the copper particles have the upper limit value of 100 μm. This is because that the upper limit value less than that brings the high crack reducing effect and the ultrafine particles of the nanometer order of the copper oxide enter between the copper particles and easily work as the binder.

Meanwhile, the average particle diameter of the copper particles has the lower limit value of 0.1 μm. This allows preventing a decrease in mechanical strength of the copper particles themselves.

The dispersing element according to the second embodiment contains the comparatively large copper particles and contains the dispersing agent. As long as the copper oxide particles are dispersible, the dispersing agent is usable without restrictions; however, the dispersing agent is preferably the organic compound having the phosphate group. In view of this, although containing the comparatively small copper oxide particles, the dispersing agent is less likely to aggregate and preferably usable for the screen-printing method. This allows preventing the aggregated particles from getting stuck in a supply passage from an accumulation container for ink to a screen in a printing device used for the screen-printing method, a screen mesh, or the like. Since the dispersing element according to the second embodiment exhibits the excellent dispersion stability against the change over time in high concentration, the screen-printing can be performed even after storage over a long period of time.

The screen-printing can form an application film as a line pattern having a comparatively wide width, for example, 100 μm and having a comparatively thick film thickness and therefore is appropriate for formation of a conductive film that can flow large electricity. Currently, the dispersing element according to the second embodiment is preferably usable for an application using expensive silver ink. Although a screen-printing device using silver ink has been popular, since the existing screen-printing device is usable, the silver ink can be easily substituted by copper ink.

When the dispersing element according to the second embodiment is applied over the board by screen-printing, the comparatively large copper particles are contained; therefore, the application film becomes bulky, and as a result, the application film having a comparatively thick film thickness can be formed.

When the application film can be formed with the dispersing element using the copper by screen-printing, the thick application film can be formed as described above, and as a result, this leads to ensure the formation of the conductive film having the thick film (for example, 1 μm or more to 100 μm or less). The conductive board including the conductive film having such a film thickness has a high conductive property and therefore is appropriate for an application, such as a transparent conductive film and an electromagnetic wave shield. With the dispersing element according to the second embodiment, silver can be exchanged for copper and a cost of these products can be substantially reduced.

In the second embodiment, the printing refers to a configuration of a desired pattern (typically including a character, an image, a design, and the like) on a medium with ink (one aspect of the dispersing element of the present invention) and is a concept included in an application.

With the dispersing element according to the second embodiment, the firing operation decomposes an organic component, such as a dispersion medium, which deteriorates a soldering performance. Accordingly, wettability of a solder to the conductive film obtained by the use of the dispersing element is enhanced, making the soldering easy.

With the dispersing element of the second embodiment, the copper particles preferably have the shapes extending in one direction, the dendritic shapes, or the flat shapes. The dispersing element of the second embodiment more preferably at least contains the copper particles having the dendritic shapes. Accordingly, for example, compared with particles having spherical shapes or regular polyhedron shapes and having a small aspect ratio, the copper particles having the specific shapes are likely to get entangled with one another and align. In view of this, the many contact points between the particles can be ensured, sintering the application film by the firing process forms the firm mechanical structure, and cracks are reduced in the obtained conductive film.

With the dispersing element according to the second embodiment, the organic compound preferably has a mass ratio to the mass of the copper oxide particles of 0.0050 or more to 0.30 or less. The organic compound having the phosphate group as the dispersing agent in this range reduces the aggregation of the copper oxide and improves the dispersion stability.

Third Embodiment

As a result of diligent examination, the inventors have found the following. The use of the dispersing element containing the copper oxide particles and the copper particles having a specific grain shape can obtain a conductive film that reduces both cracks generated during sintering and cracks generated over time, and has low resistivity and excellent stability of resistivity over time.

It has been found that although the above-described dispersing element contains the ultrafine particles in high concentration, the dispersing element is less likely to aggregate. Accordingly, it has been found that the dispersing element is also applicable to the screen-printing method and is excellent in printability. Moreover, it has been found that the above-described dispersing element exhibits excellent dispersion stability against a change over time in high concentration and allows screen-printing even after storage over a long period of time.

Furthermore, it has been found that the use of the screen-printing allows forming an application film having a comparatively thick film; therefore, the above-described dispersing element can conduct a large amount of current by the obtained conductive film.

A soldering performance to the conductive film with the use of the above-described dispersing element has been found to be satisfactory.

The inventors have completed the present invention based on such new viewpoints. That is, the dispersing element according to the third embodiment contains the copper oxide and at least one kind of the copper particles having the shapes extending in one direction, the dendritic shapes, or the flat shapes (hereinafter also referred to as the copper particles having the specific shapes).

The particles having the shapes extending in one direction can be described as follows. First, here, the shape is the shape of the primary particle. Next, an extension direction of the particle is defined as a longitudinal direction and the maximum value of the longitudinal direction is defined as a length (L). A direction perpendicular to the longitudinal direction is defined as a width direction and the maximum value of the width direction is defined as a width (W). A ratio of the length (L) to the width (W) of the particle is defined as the aspect ratio. It can be said that the shape where the aspect ratio exceeds 1 is the shape extending in one direction.

Specifically, the shape extending in one direction includes a needle shape, a pillar shape, a thread shape, a string shape, a wire shape, a rod shape, a spindle shape, and the like. Here, a difference between the needle shape and the pillar shape is not a difference in shape but the size of the particle. That is, even having the similar shapes, the shape having the comparatively long width (W) is referred to as the pillar shape and the shape having the short width (W) is referred to as the needle shape.

The shape extending in one direction is not limited to a case where a size of a cross-sectional surface is constant along the extension direction of the particle and a part larger than or smaller than the other part may be present. When the particle is regarded as a column having an equal volume, the width (W) in this case is a diameter of a bottom surface of this column.

Although the shape of the cross-sectional surface of the particle is not specifically limited, a shape may be a circle, a triangular shape, a quadrangular shape, a polygon other than those shapes, and a shape connected with a curved line and a straight line.

The particle is not limited to have a shape linearly extending in the extension direction and may be a shape extending curvedly. In this case, the shape of the particle is referred to as a hairy shape, the thread shape, the string shape, the wire shape, and a similar shape.

The shapes of the particles extending in one direction facilitate aligning the particles and the many contact points between the particles can be ensured. From this perspective, the aspect ratio of the particle is preferably 3 or more.

In the third embodiment, the dendritic shape can be described as follows. First, here, the shape is the shape of the primary particle. Next, the dendritic shape is constituted of a main having the above-described shape extending in one direction and at least one branch branched from the main. This shape is also referred to as a dendrite shape.

The dendritic shapes of the particles facilitate aligning the particles and the many contact points between the particles can be ensured. The dendritic shapes allow the particles to get entangled with one another three-dimensionally. From these perspectives, the aspect ratio of the main of this particle is preferably 3 or more. Although the number of branches is not specifically limited, two or more is preferred and three or more is especially preferred. Note that the aspect ratio of the main is identical to the aspect ratio described about the above-described particle having the shape extending in one direction.

In the third embodiment, the flat shape can be described as follows. First, here, the shape is the shape of the primary particle. Next, the flat shape is a shape having a principal surface forming a planar surface or a curved surface. The maximum length (a) of this principal surface is defined in the longitudinal direction and the maximum length (b) perpendicular to the longitudinal direction (a) is defined in the lateral direction. A ratio of the length (a) in the longitudinal direction of the principal surface to a thickness (c) of this particle is defined as the aspect ratio. The shape where the aspect ratio exceeds 3 can be said to be the flat shape.

Specifically, the flat shape includes a plate shape, a leaf-like shape, a scaly shape (also referred to as flake shape), and the like. Here, a difference between the plate shape, the leaf-like shape, and the scaly shape is not a difference in shape but the size of the particle. That is, even having the similar shapes, the shape having the comparatively thick thickness (c) is referred to as the plate shape, a thinner shape is referred to as the leaf-like shape, and further thinner shape is referred to as the scaly shape.

The flat shapes of the particles facilitate aligning the particles and the many contact points between the particles can be ensured. From these perspectives, the aspect ratio of this particle is preferably 5 or more.

The dispersing element according to the third embodiment more preferably contains at least the copper particles having the dendritic shapes.

With the dispersing element according to the third embodiment, for example, compared with particles having spherical shapes or regular polyhedron shapes and having a small aspect ratio, the copper particles having the specific shapes are likely to get entangled with one another and align. In view of this, the many contact points between the particles can be ensured.

In view of this, sintering the application film by the firing process forms the firm mechanical structure. Since the copper oxide particles are present between the copper particles, the copper oxide particles are reduced by the firing process, change into the metal copper and sinter, and are integrated with the copper particles, thus generating the electrical conduction. In other words, the copper oxide particles act as the binder to the copper particles. Accordingly, the obtained conductive film reduces cracks caused by the sudden strain and the residual strain during sintering. Additionally, the copper particles and the reduced copper oxide particles form a path as a conductor and ensure reducing the resistivity. As a result, the conductive film having the low resistivity and the high stability of resistivity over time can be obtained.

The dispersing element according to the third embodiment contains the copper particles having the specific shapes. In view of this, the dispersing agent is less likely to aggregate and preferably usable for the screen-printing method. This allows preventing the aggregated particles from getting stuck in the supply passage from the accumulation container for ink to the screen in the printing device used for the screen-printing method, the screen mesh, or the like.

Currently, the dispersing element according to the third embodiment is preferably usable for the application using the expensive silver ink. Although the screen-printing device using silver ink has been popular, since the existing screen-printing device is usable, the silver ink can be easily substituted by the copper ink.

When the dispersing element according to the third embodiment is applied over the board by screen-printing, the copper particles having the specific shapes are contained; therefore, the application film becomes bulky, and as a result, the application film having a comparatively thick film thickness can be formed.

The conductive board including the conductive film having such a film thickness has the high conductive property and therefore is appropriate for an application, such as the transparent conductive film and the electromagnetic wave shield. With the dispersing element according to the third embodiment, silver can be exchanged for copper and a cost of these products can be substantially reduced.

Since the dispersing element according to the third embodiment contains the copper particles having the specific shapes, the dispersing element is less likely to aggregate, and exhibits excellent dispersion stability against the change over time in high concentration. In view of this, the screen-printing can be performed even after storage over a long period of time.

With the dispersing element according to the third embodiment, the firing operation decomposes the organic component, such as the dispersion medium, which deteriorates the soldering performance. Accordingly, the wettability of the solder to the conductive film obtained by the use of the dispersing element is enhanced, making the soldering easy.

Especially, the dispersing element according to the third embodiment containing the copper particles having the dendritic shapes enhances the above-described effects and therefore is optimal.

FIG. 1 is a schematic diagram illustrating states of the copper oxide and the copper particles having the dendritic shapes before the dispersing element according to the third embodiment is applied over the board and the firing process is performed. As illustrated in FIG. 1, in an application film 1 before firing, a plurality of copper particles 5 having the dendritic shapes get entangled with one another or align. In view of this, the copper particles 5 are in contact at a plurality of contact points X. Copper oxide particles 2 having small particle diameters enter between these copper particles 5.

Since the copper particles 5 having the dendritic shapes are in contact with one another at branches 5b branched from mains 5a, the number of contact points X is larger than that of the copper particles having the shapes extending in one direction without branches. Consequently, the copper particles 5 are further likely to disperse and less likely to aggregate in the dispersing element and the application film 1. Consequently, the above-described effects are provided more remarkably.

With the dispersing element of the third embodiment, the copper particles preferably have the particle diameters of 0.1 µm or more to 100 µm or less, further preferably 0.5 µm or more to 50 µm or less, and especially preferably 1.0 µm or more to 10 µm or less. Thus, the crack reducing effect is high, and the ultrafine particles of the nanometer order of the copper oxide enter between the copper particles and easily work as the binder. This also allows preventing the mechanical strengths of the copper particles themselves from decreasing.

The copper oxide in the dispersing element of the third embodiment preferably has the particle diameter of 1 nm or more to 50 nm or less. Thus, the sintering is facilitated and the copper oxide particles easily enter between the copper particles and therefore the copper oxide particles easily act as the binder. Moreover, the usage of the dispersing agent can be reduced, making the firing process easy.

Thus, sintering the application film using the dispersing element containing the copper particles having the particle diameters of the micrometer order and the copper oxide particles of the nanometer order by the firing process bonds the copper particles together and forms the firm mechanical structure.

<Other Aspects>

With the dispersing elements of the second and the third embodiments, the mass ratio of the copper particles to the mass of the copper oxide particles is preferably 0.5 or more to 10 or less. The mass ratio of the copper particles to the mass of the copper oxide particles is more preferably 1.0 or more to 7.0 or less. The mass ratio of the copper particles to the mass of the copper oxide particle is further preferably 1.5 or more to 6.0 or less. With the copper particle mass ratio within this range, the copper oxide is abundantly present; therefore, bonding of the copper particles obtained through the reduction becomes sufficient. In view of this, the mechanical strength of the conductive film after the firing becomes high. The crack reducing effect brought by the copper particles obtained through the reduction is sufficiently provided.

The dispersing elements according to the second and the third embodiments contain the reductant and the mass ratio of the reductant to the mass of the copper oxide is preferably 0.0001 or more to 0.10 or less. Defining the mass ratio of the reductant improves the dispersion stability and decreases the resistance of the copper film and also improves the long-term stability of the dispersing element. Additionally, the crack reducing effect is high, and the ultrafine particles of the nanometer order of the copper oxide enter between the copper particles and easily work as the binder. This also allows preventing the mechanical strengths of the copper particles themselves from decreasing. The comparatively large copper particles are contained and the organic compound having the phosphate group is contained as the dispersing agent. Accordingly, although the comparatively small copper oxide particles are contained, the aggregation is less likely to occur.

Additionally, in the first to the third embodiments, the reductant is contained. The reductant preferably contains at least one kind selected from the group consisting of a hydrazine, a hydrazine hydrate, a sodium, a carbon, a potassium iodide, an oxalic acid, an iron sulfide (II), a sodium thiosulfate, an ascorbic acid, a tin chloride (II), a diisobutylaluminium hydride, a formic acid, a sodium borohydride, and a sulfite. This improves the dispersion stability of the copper oxide and decreases the resistance of the conductive film.

Additionally, the reductant is especially preferred to be hydrazine or hydrazine hydrate. The use of the hydrazine or the hydrazine hydrate as the reductant of the dispersing element further improves the dispersion stability of the copper oxide, contributes to the reduction of the copper oxide in firing, and further decreases the resistance of the conductive film. In reverse printing, a drying rate of the dispersing element can be regulated. Furthermore, a copper wire having a high definition (for example, 0.1 to 5 μm) wire width can be formed, and especially, the copper wire having the wire width of 5 μm or less is invisible by the eyes of a human and therefore is preferred as a transparent conductive film.

Additionally, in the first to the third embodiments, the copper oxide is preferably the cuprous oxide. This facilitates the reduction of the copper oxide and allows easily sintering the copper generated through the reduction.

In the first to the third embodiments, the dispersion medium is further contained. The dispersion medium is preferably at least one kind selected from the group consisting of terpineol, γ-butyrolactone, cyclohexanone, ethanol, propylene glycol, butanol, propanol, ethylene glycol monoethyl ether acetate, and tetralin. While these dispersion mediums may have a reduction action, when the dispersing element contains the above-described reductant, the reductant serves as the dispersion medium.

In the first to the third embodiments, the dispersion medium is further contained. Two or more kinds of the dispersion mediums are preferably contained.

<Structure with Conductive Pattern>

The structure with the conductive pattern includes the board and the conductive pattern formed on the surface of the board. The conductive pattern is the wiring having the wire width of 1 μm or more to 1000 μm or less and contains reduced copper, phosphorus, and a void. This configuration allows forming the wiring having the satisfactory shape on the board having a desired shape as described later.

The structure with the conductive pattern includes the board and the conductive pattern formed on the surface of the board. The conductive pattern is the wiring having the wire width from 1 μm or more to 1000 μm or less. The wiring contains reduced copper, copper, and tin.

The structure with the conductive pattern includes the board, a cuprous-oxide-containing layer, and the conductive layer. The cuprous-oxide-containing layer is formed on the surface of the board. The conductive layer is formed on a surface of the cuprous-oxide-containing layer. The conductive layer is the wiring having the wire width of 1 μm or more to 1000 μm or less. The wiring contains reduced copper.

The structure with the conductive pattern includes the board, the cuprous-oxide-containing layer, and the conductive layer. The cuprous-oxide-containing layer is formed on the surface of the board. The conductive layer is formed on the surface of the cuprous-oxide-containing layer. The conductive layer is the wiring having the wire width of 1 μm or more to 1000 μm or less. The wiring contains reduced copper, copper, and tin. The cuprous-oxide-containing layer is a layer having a ratio of copper to oxygen, Cu/O, of 0.5 or more to 3.0 or less. An analysis of a cross-sectional surface of the structure with the conductive pattern by EDX method allows quantitating Cu/O in the cuprous-oxide-containing layer.

In the structure with the conductive pattern, the wiring is preferably usable as an antenna. This configuration allows forming the antenna having a satisfactory shape.

In the structure with the conductive pattern, the conductive layer or the conductive pattern preferably has the surface on which the solder layer is partially formed. Since the conductive pattern is formed by firing the copper oxide in the dispersing element, an organic binder is decomposed in the firing process. In view of this, the wettability of the solder becomes high in the conductive pattern and the solder layer can be easily formed. This facilitates soldering electronic components in the conductive pattern compared with a conductive pattern formed without using the above-described dispersing element.

The structure with the conductive pattern includes the board and the conductive pattern. The conductive pattern is formed on the surface of the board. The conductive pattern is the wiring having the wire width of 1 μm or more to 1000 μm or less. The wiring contains reduced copper, copper oxide, and phosphorus. Resin is disposed so as to cover the wiring.

(Configuration of Structure with Conductive Pattern)

The use of the dispersing elements according to the first to the third embodiments allows obtaining two kinds of the structures with the conductive patterns by methods of firing. FIG. 2 includes cross-sectional schematic diagrams illustrating the structure with the conductive pattern according to the embodiment. Forming the application film with the dispersing element on the board and irradiating the copper oxide particles of the dispersing element with laser and firing the copper oxide particles allow obtaining the structure with the conductive pattern of FIG. 2A. A desired pattern is printed with the dispersing element on the board and firing this pattern with plasma allow obtaining the structure with the conductive pattern of FIG. 2B.

Figure 2A:
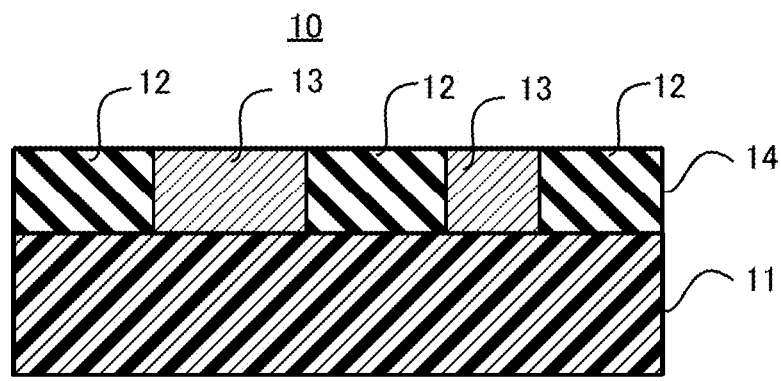
FIG. 2 includes cross-sectional schematic diagrams illustrating a structure with a conductive pattern according to an embodiment.

As illustrated in FIG. 2A, a structure with a conductive pattern 10 may include a board 11 and a superficial layer 14 that includes insulating regions 12 containing copper oxide and a phosphorus-containing organic matter and conductive pattern regions 13 containing reduced copper produced by reduction of copper oxide by firing disposed adjacent to one another in a cross-sectional surface view on the surface constituted by the board 11. The conductive pattern region 13 contains a phosphorus element derived from the phosphorus-containing organic matter as the dispersing agent. The conductive pattern region 13 is formed by firing copper oxide ink as the dispersing element; therefore, the organic binder contained in the dispersing element is decomposed in the firing process, and the wettability of the solder becomes high in the obtained conductive pattern region 13. Accordingly, compared with the conductive pattern formed without the use of the dispersing element, the solder layer described later can be easily formed on the surface of the conductive pattern region 13 and the electronic component is easily soldered.

Figure 2B:
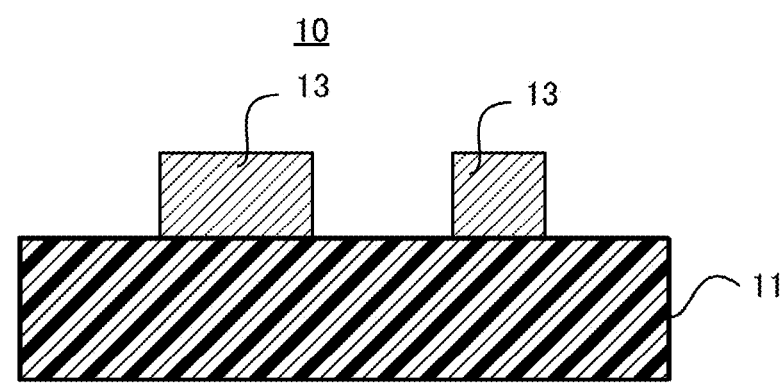

As illustrated in FIG. 2B, the structure with the conductive pattern 10 may include the board 11 and the conductive pattern regions 13 containing reduced copper in the cross-sectional surface view on the surface constituted by the board 11. The conductive pattern region 13 contains a phosphorus element. In the conductive pattern region 13, since the organic binder contained in the dispersing element is effectively decomposed in the step of firing the dispersing element, the wettability of the solder becomes effectively high in the conductive pattern region 13. Accordingly, the solder layer can be further easily formed on the surface of the conductive pattern region 13.

The conductive pattern region 13 may contain, for example, a part of cuprous oxide as copper oxide particles not reduced in the firing process. The conductive pattern region 13 may contain the copper produced by firing the copper particles of the dispersing element of the second and the third embodiments or may contain tin. The insulating region 12 and the conductive pattern region 13 may contain a void. The presence of the void (hollow wall) in the conductive pattern region 13 causes the solder to enter into the void and improves adhesiveness between the conductive pattern region 13 and the solder layer. Incidentally, the solder refers to metal containing tin.

Further, the superficial layer 14 does not mean one entirely homogeneous but, like a relationship between the insulating region 12 and the conductive pattern region 13, may differ in electrical conductivity, a particle state (fired and not fired), or the like, or a boundary (interface) may be present between both.

Figure 2C:
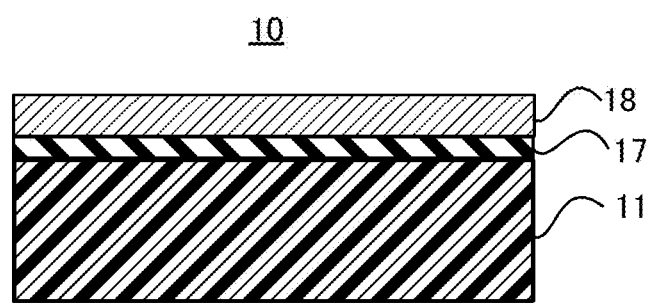

In this case, for example, as illustrated in FIG. 2C, on a conductive layer 18, for example, a cuprous-oxide-containing layer 17 containing cuprous oxide as copper oxide particles not reduced in the firing process may be formed on the surface of the board 11. The conductive layer 18 containing reduced copper formed by reduction of the copper oxide particles may be formed on the surface of the cuprous-oxide-containing layer 17. Thus, the formation of the cuprous-oxide-containing layer 17 improves adhesiveness between the board 11 and the conductive layer 18 and therefore is preferred. From a perspective of the adhesiveness between the board 11 and the conductive layer 18, the layer thickness of the cuprous-oxide-containing layer 17 is preferably 0.005 µm or more to 8 µm or less, more preferably 0.05 µm or more to 5 µm or less, further preferably 0.1 µm or more to 3 µm or less, and especially preferably 0.2 µm or more to 1 µm or less.

Figure 2D:
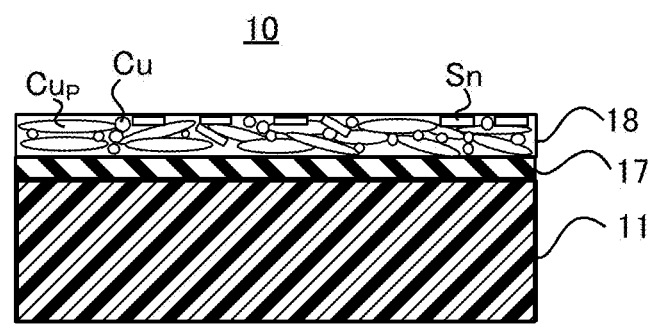

As illustrated in FIG. 2D, the conductive layer 18 may contain copper (Cup) produced by firing the copper particles in the dispersing element of the second and the third embodiments together with reduced copper (Cu) produced by reducing the copper oxide particles. The conductive layer 18 may include a void. The presence of the void in the conductive layer 18 causes tin (Sn) contained in the solder to enter into the void. This improves the adhesiveness between the conductive layer 18 and the solder layer. Furthermore, the presence of the reduced copper (Cu) around the copper (Cup) further increases the adhesiveness between the conductive layer 18 and the tin (Sn). The particle diameter of the reduced copper (Cu) at this time is preferably 5 to 20 nm.

The coppers contained in the conductive pattern region 13 and the conductive layer 18 preferably have grain sizes of 0.1 µm or more to 100 µm or less, 0.5 µm or more to 50 µm or less is further preferred, and 1.0 µm or more to 10 µm or less is especially preferred. Here, the grain size means the size of the metal after firing. This increases the adhesiveness between conductive pattern region 13 and the conductive layer 18, and the solder layer.

The surface roughnesses of the surfaces of the conductive pattern region 13 and the conductive layer 18 are preferably 500 nm or more to 4000 nm or less, more preferably 750 nm or more to 3000 nm or less, and further preferably 1000 nm or more to 2000 nm or less. This facilitates adhesion of the solder layer to the conductive pattern region 13 and the conductive layer 18 and increases the adhesiveness between the conductive pattern region 13 and the conductive layer 18, and the solder layer.

As illustrated in FIG. 2, the formation of the conductive pattern regions 13 or the conductive layer 18 allows drawing the wiring having the wire width of 0.1 µm or more to 1 cm or less, and the wiring is usable as a copper wiring or an antenna. Exercising the feature of the nano particles of the copper oxide particles contained in the dispersing element, the wire width of the conductive pattern region 13 or the conductive layer 18 is more preferably 0.5 µm or more to 10000 µm or less, further preferably 1 µm or more to 1000 µm or less, further more preferably 1 µm or more to 500 µm or less, yet further more preferably 1 µm or more to 100 µm or less, and especially preferably 1 µm or more to 5 µm or less. The wire width of 5 µm or less cannot visually perceive the conductive pattern region 13 or the conductive layer 18 as the wiring and therefore is preferred from the perspective of designability.

The conductive pattern may be formed into a mesh shape. The mesh shape refers to wiring in a grid shape that increases transmittancy and becomes transparent and therefore is preferred.

The board used in the embodiment has a surface forming the application film and may have a plate shape or may be a three-dimensional object. In the embodiment, a conductive pattern can be formed on a surface including a curved surface, a step, and the like constituted by the three-dimensional object. The board in the embodiment means a board material of a circuit board sheet to form a wiring pattern, a casing material of a casing with wiring, or the like.

A light-transmitting resin layer (not illustrated) may be disposed so as to cover the superficial layer 14 or the conductive pattern region 13. In the method for manufacturing the structure with the conductive pattern 10 described later, the resin layer prevents the application film from touching oxygen during light irradiation and allows promoting the reduction of the copper oxide. This sets a peripheral area of the application film in an oxygen-free atmosphere or a low-oxygen atmosphere during light irradiation. For example, this eliminates the need for facility for a vacuum atmosphere or an inert gas atmosphere, thereby ensuring saving a manufacturing cost. Additionally, the resin layer can prevent the conductive pattern region 13 from peeling or scattering due to heat by light irradiation or the like. This allows manufacturing the structures with the conductive patterns 10 at a good yield.

<Method for Manufacturing Structure with Conductive Pattern>

The method for manufacturing the structure with the conductive pattern includes a step of applying the dispersing element over the board to form the application film and a step of irradiating the application film with laser light to form the conductive pattern on the board. Performing the firing by laser irradiation allows performing the firing of the copper particles of the dispersing element and the formation of the conductive pattern at once.

The method for manufacturing the structure with the conductive pattern includes a step of applying the dispersing element on the board in a desired pattern to form the application film and a step of performing the firing process on the application film to form the conductive pattern on the board.

At this time, the firing process is preferably performed by generating plasma under an atmosphere containing reducing gas. The firing process is preferably performed by light irradiation method. Additionally, the firing process is preferably performed by heating the application film by heat at 100° C. or more.

[Method for forming Conductive Film (Conductive Pattern)]

The method for forming the conductive film of the embodiment reduces the copper oxide in the application film to generate the copper, and fuses itself and fuses with the copper particles added to the copper oxide ink as the dispersing element to be integrated to form the conductive film (copper film). This step is referred to as firing. Therefore, as long as the method can form the conductive film through the reduction and the fusion of the copper oxide and the integration with the copper particles, the method is not especially restricted. The firing in the method for forming the conductive film of the embodiment, for example, may be performed with a kiln, or may be performed by the use of plasma, infrared, a flash lamp, laser, and the like alone or in combination of these methods. After the firing, the solder layer described later can be formed on a part of the conductive film.

Figure 3:
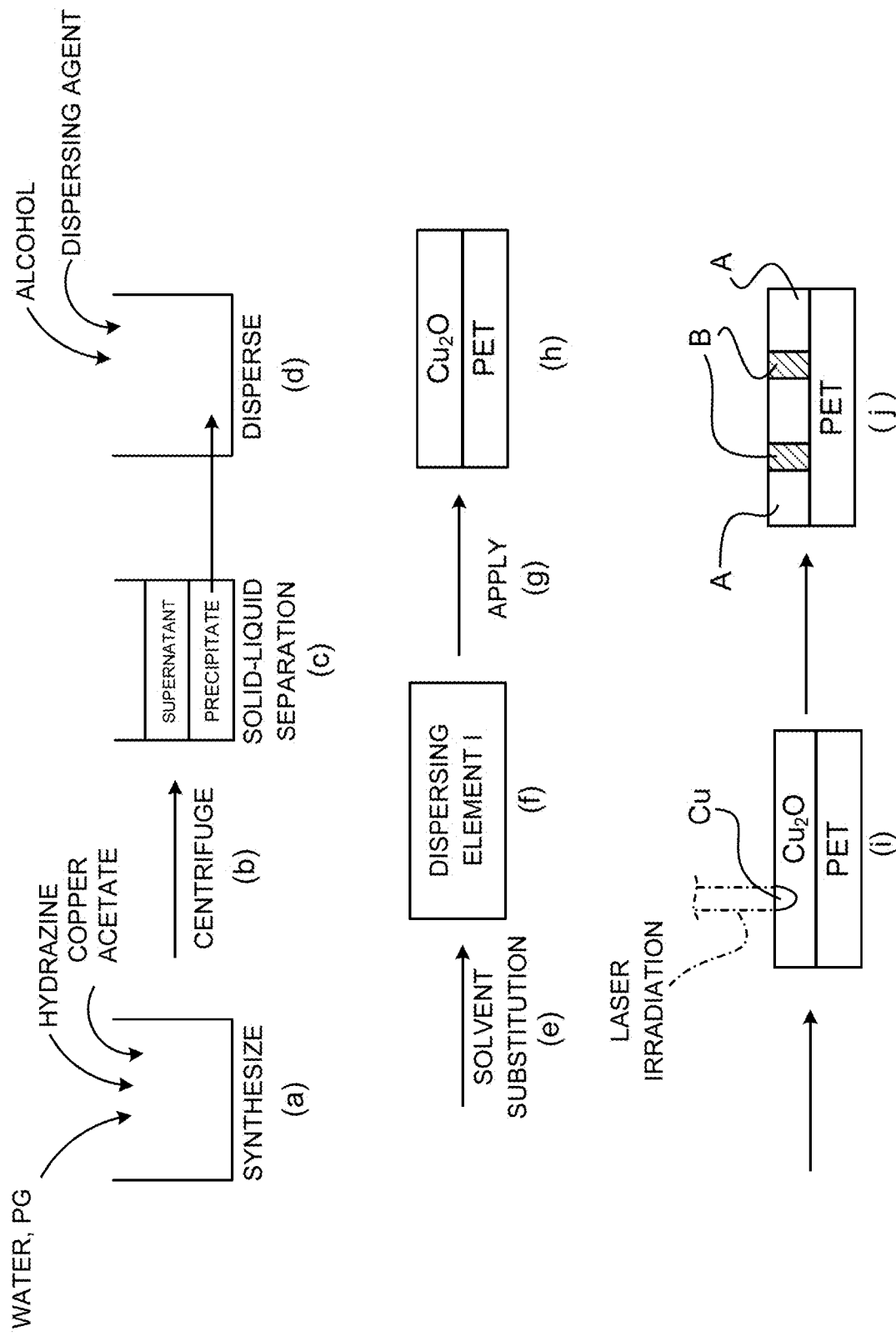
FIG. 3 is an explanatory view illustrating respective steps in the case of using laser irradiation for firing in a method for manufacturing the structure with the conductive pattern according to the embodiment.

With reference to FIG. 3, the following further specifically describes the method for manufacturing the structure with the conductive pattern using the laser irradiation for the firing according to the embodiment. FIG. 3 is an explanatory view illustrating respective steps in the case of using the laser irradiation for the firing in the method for manufacturing the structure with the conductive pattern according to the embodiment. In (a) of FIG. 3, copper acetate is dissolved in mixed solvent of water and propylene glycol (PG), and hydrazine is added and stirred.

Next, in (b) and (c) of FIG. 3, the product is separated into supernatant and precipitate by centrifugation. Next, in (d) of FIG. 3, dispersing agent and alcohol are added to the obtained precipitate and then the product is dispersed.

Next, in (e) and (f) of FIG. 3, concentration and dilution are repeated with a UF membrane module and the solvent is substituted to obtain a dispersing element I (copper oxide ink) containing copper oxide.

In (g) and (h) of FIG. 3, the dispersing element I is applied over a board made of, for example, PET (described as "PET" in (h) of FIG. 3) by spray coating method to form an application layer (application film) (described as "Cu$_2$O" in (h) of FIG. 3) containing copper oxide and a phosphorus-containing organic matter.

Next, in (i) of FIG. 3, the application layer is, for example, irradiated with laser to selectively fire a part of the application layer and the copper oxide is reduced to copper (described as "Cu" in (i) of FIG. 3). As a result, in (j) of FIG. 3, the structure with the conductive pattern including the superficial layer in which insulating regions (described as "A" in (j) of FIG. 3) containing copper oxide and a phosphorus-containing organic matter and conductive film (conductive pattern) regions (described as "B" in (j) of FIG. 3) containing copper and a phosphorus element are disposed adjacent to one another is obtained on the board. The conductive pattern region is usable as a wiring.

The conductive pattern region may contain, for example, cuprous oxide as copper oxide particles not reduced in the firing process. The insulating region and the conductive pattern region may contain the copper produced by firing the copper particles of the dispersing element of the second and the third embodiments or may contain tin. The insulating region and the conductive pattern region may contain a void. The presence of the void in the conductive pattern region causes the solder to enter into the void and improves adhesiveness between the conductive pattern region and the solder layer.

Further, the superficial layer does not mean one entirely homogeneous but, like a relationship between the insulating region and the conductive pattern region, may differ in electrical conductivity, a particle state (fired and not fired), or the like, or a boundary (interface) may be present between both. The formation of the layer of the copper oxide not reduced between the board and the superficial layer improves the adhesiveness between the board and the superficial layer and therefore is preferable.

Thus, performing the firing by laser irradiation allows performing the firing of the copper particles of the dispersing element and the formation of the conductive pattern at once. Moreover, since firing the copper particles decomposes the organic binder contained in the dispersing element, the wettability of the solder increases in the obtained conductive pattern.

Figure 4:
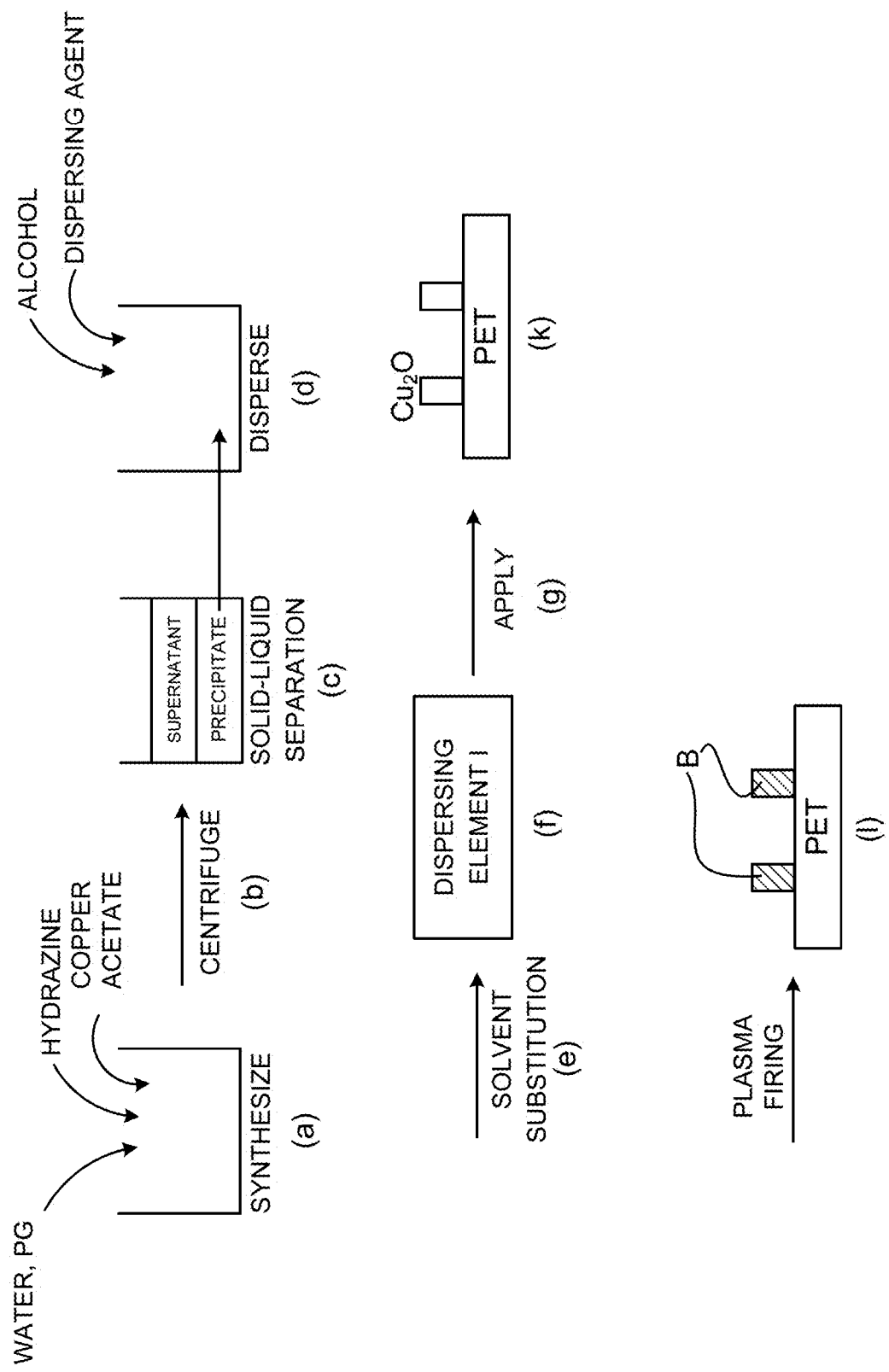
FIG. 4 is an explanatory view illustrating respective steps in the case of using plasma for the firing in the method for manufacturing the structure with the conductive pattern according to the embodiment.

Next, with reference to FIG. 4, the following further specifically describes the method for manufacturing the structure with the conductive pattern using plasma for the firing according to the embodiment. FIG. 4 is an explanatory view illustrating respective steps in the case of using plasma for the firing in the method for manufacturing the structure with the conductive pattern according to the embodiment. The steps of (a) to (f) of FIG. 4 are similar to those of FIG. 3.

In (g) and (k) of FIG. 4, on the board made of, for example, PET, the dispersing element I is printed in a desired pattern by, for example, ink-jet printing to form an application layer containing copper oxide and a phosphorus-containing organic matter (described as "Cu$_2$O" in (k) of FIG. 4).

Next, in (k) of FIG. 4, the application layer is, for example, irradiated with plasma and fired to reduce the copper oxide into copper. As a result, in (l) of FIG. 4, a conductive board in which conductive pattern regions (described as "B" in (l) of FIG. 4) containing the copper and a phosphorus element are formed is obtained on the board.

Thus, the firing by the plasma irradiation allows firing the copper particles of the dispersing element printed in the desired pattern by ink-jet printing or the like. Additionally, since the organic binder contained in the dispersing element is effectively decomposed, the wettability of the solder becomes effectively high in the obtained conductive pattern region.

(Method for Forming Application Film on Board with Dispersing Element)

In the method for manufacturing the structure with the conductive pattern, the desired pattern is preferably formed by application of the dispersing element by aerosol method, and the dispersing element is preferably applied by screen-printing. The dispersing elements according to the first to the third configurations have viscosity and flow characteristics appropriate for screen-printing and are therefore are preferably usable for screen-printing.

The method for manufacturing the structure with the conductive pattern forms the application film on a transfer body and then preferably transfers the application film from the transfer body to the board to form the application film on the board.

Figure 5:
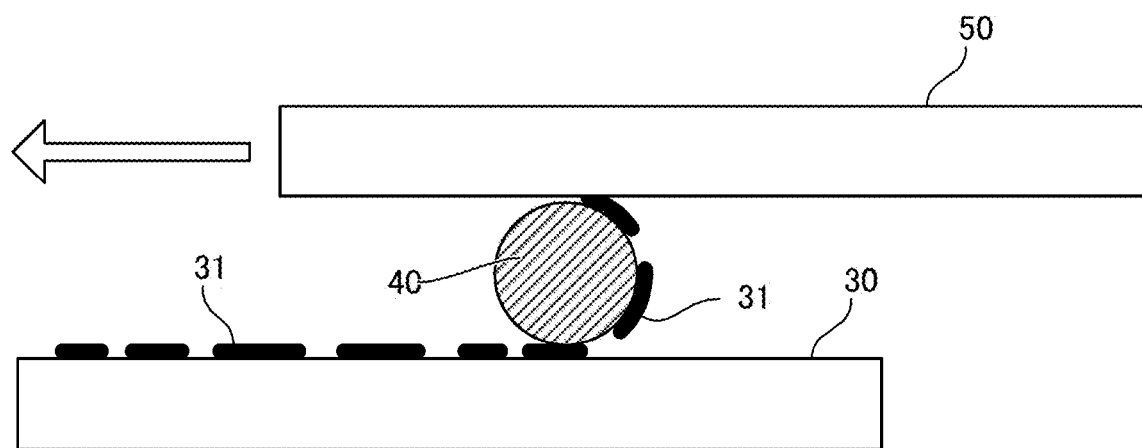
FIG. 5 is a drawing describing a method for forming an application film using a transfer body according to the embodiment.

FIG. 5 is a drawing describing the method for forming the application film using the transfer body according to the embodiment. FIG. 6 is a drawing describing another example of the method for forming the application film using the transfer body according to the embodiment.

As illustrated in FIG. 5, a dispersing element 31 is transferred to a transfer body 30 in a desired pattern. On the surface of the transfer body 30 where the dispersing element 31 has been transferred, for example, a column-shaped board 40 (a circular shape in the cross-sectional surface view) is placed, and then a pressing plate 50 is put on the board 40. While the board 40 is pressed to the transfer body 30 with the pressing plate 50, the board 40 is rotated on the transfer body 30. This transfers the dispersing element 31 on the transfer body 30 to the board 40.

Thus, when the board 40 is pressed to the surface of the transfer body 30 on which the dispersing element 31 has been transferred, the transfer body 30 and the board 40 are in line contact. In view of this, in addition to the case of the printing surface of the board 40 being a plane, fine printing is possible also in the case of the printing surface being a curved surface and having ups and downs.

Figure 6A:
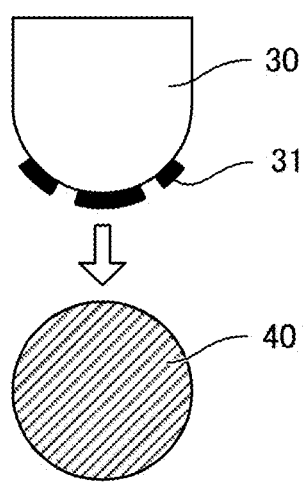
FIG. 6 includes drawings describing another example of the method for forming the application film using the transfer body according to the embodiment.
Figure 6B:
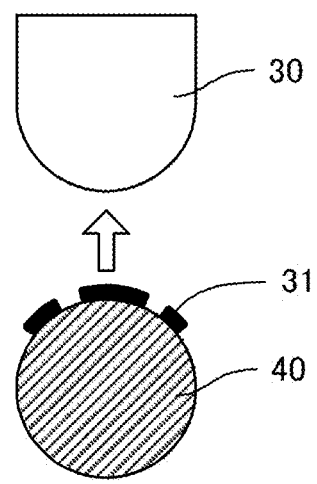

As illustrated in FIG. 6A, the dispersing element 31 is transferred to the transfer body 30 in a desired pattern. Then, by moving the transfer body 30 relative to the board 40 in the printing direction while pressing the transfer body 30 against the board 40, the dispersing element 31 on the transfer body 30 may be transferred to the board 40 as illustrated in FIG. 6B. The transfer body 30 may have the plate shape as illustrated in FIG. 5 or may have the curved surface as illustrated in FIG. 6. Thus, the dispersing element 31 is transferred from the transfer body 30 to the board 40 by a predetermined pressing force, even when the printing surface of the board 40 is curved, satisfactory printing is possible.

The formation of the desired pattern in the method for manufacturing the structure with the conductive pattern preferably includes a step of applying the dispersing element over the transfer body and then contacting a convex portion to the transfer body and removing an unnecessary dispersing element to form a desired pattern on the surface of the transfer body, and a step of contacting the board with the surface of the transfer body to transfer the desired pattern to the board.

Figure 7:
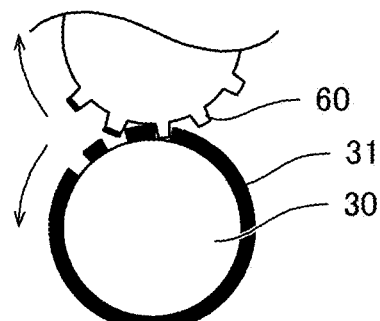
FIG. 7 is a drawing describing a method for forming a pattern on the transfer body according to the embodiment.

The following describes the method for forming the desired pattern to the transfer body with reference to FIG. 7. FIG. 7 is a drawing describing the method for forming the pattern to the transfer body according to the embodiment.

As illustrated in FIG. 7, for example, convex portions 60 of a mold are brought into contact with the dispersing element 31 applied over the surface of the transfer body 30 to remove the dispersing elements at parts contacted by the convex portions 60 from the surface of the transfer body 30. This forms the desired pattern of the dispersing element 31 on the surface of the transfer body 30. Then, the transfer body 30 on which this desired pattern has been formed is brought into contact with the board 40, thus ensuring transferring the desired pattern to the board 40 (see FIG. 5 and FIG. 6B). The method for applying the dispersing element 31 over the surface of the transfer body 30 is not specifically limited as long as the method can uniformly apply the dispersing element 31 over the surface of the transfer body 30.

The conductive pattern in the structure with the conductive pattern is preferably an antenna. The conductive pattern may be formed into a mesh shape. The conductive pattern preferably has the wire width of 1 μm or more to 1000 μm or less.

The method for manufacturing the structure with the conductive pattern preferably further includes a step of forming the solder layer on a part of the surface of the conductive pattern. Since the firing process of the copper decomposes the organic binder contained in the application film, the wettability of the solder becomes high in the surface of the obtained conductive pattern and the solder layer can be easily formed.

The method for manufacturing the structure with the conductive pattern preferably solders an electronic component on the conductive pattern via the solder layer by reflow method.

The method for manufacturing the structure with the conductive pattern performs the firing process by plasma firing method that generates plasma under the atmosphere containing reducing gas or light irradiation method, and this allows using a material having a low heat resistance for the structure.

Additionally, the method for manufacturing the structure with the conductive pattern performing the firing process decomposes the organic matter contained in the dispersing element, in addition to the reduction of the copper oxide and the firing of the copper particles. Accordingly, an increase in resistivity is prevented, the organic matter and an oxide film are removed from the surface of the conductive film, and the soldering performance can be improved. The firing process decomposes the organic component, such as the dispersion medium, which deteriorates the soldering performance. Accordingly, the wettability of the solder to the conductive film is enhanced, making the soldering easy. Accordingly, the structure with the conductive pattern including the conductive film excellent in soldering performance can be obtained. To decompose the organic component in the conductive film, especially the firing process that generates plasma under the atmosphere containing the reducing gas is more preferred.

Next, the following further describes the components of the dispersing element according to the first to the third embodiments in detail.

[Dispersing Element]

Figure 8:
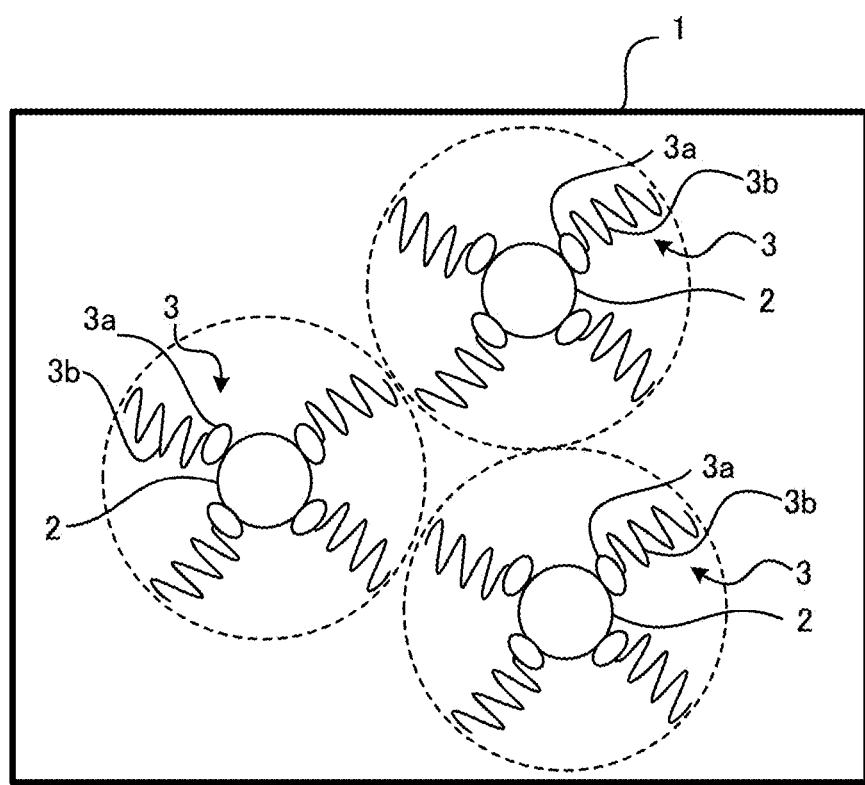
FIG. 8 is a schematic diagram illustrating a relationship between copper oxide and phosphoric acid ester salt according to the embodiment.

Next, the following describes states of the copper oxide and the dispersing agent in the copper oxide ink as the dispersing element with reference to FIG. 8. FIG. 8 is a schematic diagram illustrating a relationship between the copper oxide and phosphoric acid ester salt according to the embodiment.

As illustrated in FIG. 8, in a dispersing element 1, for example, phosphoric acid ester salt 3 as an example of a phosphorus-containing organic matter as the dispersing agent surrounds copper oxide 2 as an example of the copper oxide orientating phosphoruses 3a inside and ester salts 3b outside. Since the phosphoric acid ester salt 3 exhibits an electrical insulating property, electrical conduction with the adjacent copper oxide 2 is interfered. The phosphoric acid ester salt 3 reduces the aggregation of the dispersing element 1 by an effect of steric hindrance.

Accordingly, the copper oxide 2 is a semiconductor and has a conductive property but is covered with the phosphoric acid ester salt 3 exhibiting the electrical insulating property. Accordingly, the dispersing element 1 exhibits the electrical insulating property and can ensure insulation between conductive pattern regions (described later) adjacent to both sides of the dispersing element 1 in the cross-sectional surface view (the cross-sectional surface taken along the top-down direction illustrated in FIG. 2).

Meanwhile, in the conductive pattern region, a part of the region of the application film containing the copper oxide and the phosphorus-containing organic matter is irradiated with light and reduces the copper oxide to the copper in this part of the region. The copper produced by thus reducing the copper oxide is referred to as reduced copper. The phosphorus-containing organic matter is denatured to phosphorus oxide in this part of the region. In the phosphorus oxide, an organic matter, such as the above-described ester salt 3b, is decomposed by heat, such as laser, and thus does not exhibit an electrical insulating property.

As illustrated in FIG. 8, with the use of the copper oxide 2, heat, such as laser, changes the copper oxide into the reduced copper and sinters the copper oxide 2 to integrate the adjacent copper oxides 2. Accordingly, the region having the excellent electrical conductivity (hereinafter referred to as "conductive pattern region") can be formed.

In the conductive pattern region, a phosphorus element remains in the reduced copper. The phosphorus element is present as at least one of an elemental phosphorus alone, phosphorus oxide, and a phosphorus-containing organic matter. The thus remaining phosphorus element is present segregated in the conductive pattern region and there is no possibility of an increase in resistance of the conductive pattern region.

[Copper Oxide]

In the embodiment, the copper oxide is used as one metal oxide component. As the copper oxide, cuprous oxide ($Cu_2O$) is preferred. This is because the reduction of the cuprous oxide is easy among metal oxides, and further the use of microparticles facilitates sintering. Additionally, in terms of the price, the copper is inexpensive compared with noble metals, such as silver, and is advantageous in migration.

The dispersing element according to the embodiment contains the copper oxide particles having the average secondary particle diameter of 1 nm or more to 500 nm or less.

Although not specifically limited, the average secondary particle diameter of the copper oxide is preferably 500 nm or less, more preferably 200 nm or less, and further preferably 80 nm or less. The average secondary particle diameter of the copper oxide is preferably 1 nm or more, more preferably 5 nm or more, further preferably 10 nm or more, and especially preferably 15 nm or more. Here, the average secondary particle diameter refers to an average particle diameter of aggregates (secondary particles) formed of a collection of a plurality of primary particles.

This average secondary particle diameter of 500 nm or less tends to facilitate formation of a fine pattern on the board and therefore is preferred. The average secondary particle diameter of 1 nm or more improves long-term storage stability of the copper oxide ink as the dispersing element and therefore is preferred. The average secondary particle diameter of the copper oxide can be measured by cumulant method using, for example, FPAR-1000 manufactured by OTSUKA ELECTRONICS.

The preferable range of the average primary particle diameter of the copper oxide needs to be a low temperature further from perspectives of denseness and an electrical characteristic of the metal obtained by performing a reduction treatment on the copper oxide and further from a perspective of reducing damage given to the board considering the use of a resin board of the firing condition. In view of this, the average primary particle diameter is preferably 100 nm or less, more preferably 50 nm or less, and further preferably 20 nm or less. The average primary particle diameter of 100 nm or less can reduce input energy so as not to damage the board in a firing process described later. While the lower limit value of the average primary particle diameter of the cuprous oxide is not especially restricted, in terms of ease of handling, 1 nm or more is preferred and 5 nm or more is more preferred. Thus, an increase in usage of the dispersing agent to keep the dispersion stability due to the excessively small particle diameter is reduced and the firing process becomes easy. The average primary particle diameter can be measured with a transmission electron microscope or a scanning electron microscope.

The copper oxide in the dispersing element is easily reduced by plasma treatment, heat treatment at 100° C. or more, or light treatment and turns into metal, and obtains a conductive property through sintering. The copper oxide further works as a binder to the added copper particles to be integrated, thus contributing to low resistivity and improvement in strength. Note that in the embodiment, the average particle diameter of the cuprous oxide particles does not affect the crack preventing effect brought by the copper particles having the wire shapes, the dendritic shapes, and the scaly shapes described later.

As the cuprous oxide, commercially available cuprous oxide may be used or synthesized cuprous oxide may be used. There is provided a commercial product manufactured by RMML Co., Ltd. having an average primary particle diameter of 5 to 50 nm. The synthetization method includes the following.

(1) A heating and reduction method adds water and copper acetylacetonate complex in polyol solvent, once heats and dissolves an organic copper compound, and then adds water required for reaction and further the temperature is increased to heat the solvent at a reduction temperature of organic copper.

(2) A method heats an organic copper compound (copper-N-nitrosophenylhydroxyamine complex) at a high temperature around 300° C. in an inert atmosphere under presence of a protecting material, such as hexadecylamine.

(3) A method reduces copper salt dissolved in water solution with hydrazine.

Among these methods, the operation of the method (3) is simple and cuprous oxide having a small average particle diameter is obtained and therefore is preferred.

Since the obtained cuprous oxide is a soft aggregate, a copper oxide dispersing element dispersed into a dispersion medium is manufactured and used for printing and application. Synthesized solution and the cuprous oxide are separated after ending the synthetization, and it is only necessary to use the known method, such as centrifugation. Additionally, a dispersing agent and a dispersion medium described later are added to the obtained cuprous oxide, and the product is stirred and dispersed by the known method, such as a homogenizer. There may be cases where the dispersion is difficult and the dispersion is insufficient depending on the dispersion medium. In such cases, as one example, after dispersion using alcohols that facilitate dispersion, for example, butanol and the like as the dispersion medium, the product is substituted by a desired dispersion medium and concentrated to a desired concentration. One example of the method includes a method of repetition of a concentration with a UF membrane, dilution with a desired dispersion medium, and concentration. The copper oxide dispersing element thus obtained may be mixed with copper particles and the like by a method described later and can be provided as the dispersing element of the embodiment. This dispersing element is used for printing and application.

[Copper Particles]

The dispersing element according to the second embodiment contains the copper particles having the particle diameter of 0.1 µm or more to 100 µm or less.

The dispersing element according to the third embodiment contains at least one kind of the copper particles having the shapes extending in one direction, the dendritic shapes, or the flat shapes.

The reasons for using the copper particles for such a dispersing element are as follows. Since the copper particles are metal identical to metal copper obtained through reduction of cuprous oxide, copper leaching and formation of an intermetallic compound do not become problems, and electrical conductivity of a conductive pattern obtained finally is satisfactory and the mechanical strength is sufficient.

The average particle diameter of the particles having the shapes extending in one direction and the particles having the dendritic shapes is an average grain diameter (median diameter, mass basis, D50) measured using a particle size distribution measurement device using a laser diffraction scattering method. The average primary particle diameter of the particles having the flat shapes is a diameter of a circle when its principal surface is regarded as this circle having an equal area.

The particle diameters of the copper particles only need to be determined in accordance with the shape and the size of the pattern in the range of the embodiment. For example, in the case where the pattern is configured of lines, the particle diameter may be determined in accordance with their thicknesses and pitches. The particle diameters of the copper particles only need to be determined considering the method for forming an application film, that is, the printing method or the application method.

Especially in screen-printing, it is important to cause the components contained in the dispersing element, especially, the copper particles to pass through so as not to get stuck in a screen mesh, and the particle diameter needs to be selected considering a mesh size of a plate. In the case where the particles are excessively large, the particles get stuck in the screen mesh and cause problems that an exit of the particles generates pinholes and smoothness of the surface of the application film is deteriorated. Especially, when a pattern of the application film is configured of narrow lines, a mesh with the large number of meshes is used for a screen, and dimensions of the openings decrease as a result; therefore, a breaking of a wire due to the pinhole caused by clogging becomes a problem.

As the copper particles, except for ones made of only the metal copper, ones whose surfaces are coated with copper oxide (cuprous oxide or cupric oxide) or dissimilar metal or its oxide, such as silver or silver oxide, may be used. The use of these metals also sufficiently provides the effect of reducing cracks. That is, even when the surfaces of the copper particles are coated with the copper oxide, the silver oxide, or the like, the copper oxide, the silver oxide, or the like is easily reduced during firing and therefore the conductivity of the conductive film can be maintained.

As the copper particles according to the embodiment, commercially available copper particles may be used or synthesized copper particles may be used.

Examples of the commercial product can include electrolytic copper powder EAZ-2T manufactured by MITSUI MINING & SMELTING CO., LTD. as the copper particles having the shapes extending in one direction, electrolytic copper powder EAX-2 manufactured by MITSUI MINING & SMELTING CO., LTD. as the dendritic-shaped copper particles, and 1400YP manufactured by MITSUI MINING & SMELTING CO., LTD. as the copper particles having the flat shapes.

[Copper Particle Mass Ratio]

In the dispersing element according to the second and the third embodiments, the mass ratio of the copper particles to the mass of the copper oxide particles (hereinafter referred to as copper particle mass ratio) is preferably 0.5 or more to 10 or less, more preferably 1.0 or more to 7.0 or less, further preferably 1.5 or more to 6.0 or less, and especially preferably 2.0 or more to 5.0 or less. With the copper particle mass ratio within this range, the cuprous oxide is abundantly present; therefore, the bonding between the copper particles obtained through reduction becomes sufficient, thus increasing the mechanical strength of the conductive film after firing. The crack reducing effect brought by the copper particles obtained through the reduction is sufficiently provided.

The copper particle mass ratio of the dispersing element containing other metal particles is determined by the sum with the copper particles, and the copper particle mass ratio of the dispersing element containing other metal oxide particles is determined by the sum with the copper oxide.

[Dispersing Agent]

The following describes the dispersing agent. An example of the dispersing agent includes a phosphorus-containing organic matter. The phosphorus-containing organic matter may adsorb to the copper oxide and in this case reduces aggregation by the effect of steric hindrance. The phosphorus-containing organic matter is a material exhibiting the electrical insulating property in the insulating region. The phosphorus-containing organic matter may be a single molecule or may be a mixture of a plurality of kinds of molecules.

The dispersing agent has an acid value preferably 20 or more to 130 or less. By thus limiting the range of the acid value of the dispersing agent effectively improves the dispersion stability of the dispersing element.

The mass ratio of the organic compound to the mass of the copper oxide particles in the dispersing element is preferably 0.0050 or more to 0.30 or less.

A number average molecular weight of the dispersing agent is not especially restricted but is preferably 300 or more, more preferably 500 or more, and further preferably 1000 or more. The number average molecular weight of the dispersing agent is not especially restricted, but is preferably 30000 or less, more preferably 20000 or less, and further preferably 10000 or less. The number average molecular weight of 300 or more tends to exhibit an excellent insulating property and increase the dispersion stability of the obtained dispersing element, and the number average molecular weight of 30000 or less facilitates firing. As a structure, phosphate ester of a high molecular weight copolymer having a group having affinity to copper oxide is preferred. For example, the structure of the chemical formula (1) adsorbs the copper oxide, especially the cuprous oxide, and is excellent in adhesiveness to the board and therefore is preferred.

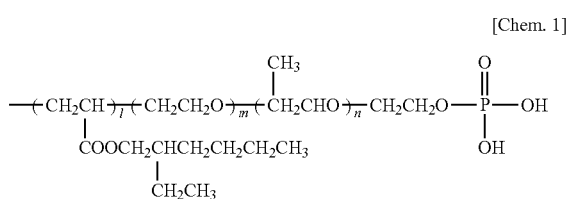

The phosphorus-containing organic matter is preferred to be easily decomposed or vaporized by light and heat. The use of the organic matter easily decomposed or vaporized by light and heat is less likely to remain a residue of the organic matter after firing, thereby ensuring obtaining the conductive pattern region having low resistivity.

Although not limited, a decomposition temperature of the phosphorus-containing organic matter is preferably 600° C. or less, more preferably 400° C. or less, and further preferably 200° C. or less. Although not limited, a boiling point of the phosphorus-containing organic matter is preferably 300° C. or less, more preferably 200° C. or less, and further preferably 150° C. or less.

Although an absorption property of the phosphorus-containing organic matter is not limited, the phosphorus-containing organic matter can preferably absorb light used for firing. For example, with the use of laser light as a light source for firing, the use of the phosphorus-containing organic matter that can absorb light with its emission wavelength of, for example, 355 nm, 405 nm, 445 nm, 450 nm, 532 nm, and 1056 nm is preferred. With a board made of resin, the wavelengths of 355 nm, 405 nm, 445 nm, and 450 nm are especially preferred.

The known dispersing agents are usable, and examples include a macromolecule having a basic group, such as long-chain polyaminoamide and salt of polar acid ester, unsaturated polycarboxylic acid polyaminoamide, polycarboxylate of polyaminoamide, long-chain polyaminoamide and salt of acid polymer, and the like. The examples include acrylic-based polymer, acrylic-based copolymer, modified polyester acid, polyetherester acid, polyether-based carboxylic acid, and macromolecular alkyl ammonium salt, such as polycarboxylic acid, amine salt, amido amine salt, and the like. As such a dispersing agent, a commercially available one is usable.

Examples of the commercial product include DISPERBYK (registered trademark)-101, DISPERBYK-102, DISPERBYK-110, DISPERBYK-111, DISPERBYK-112, DISPERBYK-118, DISPERBYK-130, DISPERBYK-140, DISPERBYK-142, DISPERBYK-145, DISPERBYK-160, DISPERBYK-161, DISPERBYK-162, DISPERBYK-163, DISPERBYK-2155, DISPERBYK-2163, DISPERBYK-2164, DISPERBYK-180, DISPERBYK-2000, DISPERBYK-2025, DISPERBYK-2163, DISPERBYK-2164, BYK-9076, BYK-9077, TERRA-204, TERRA-U (manufactured by BYK up to here), F1OWLEN DOPA-15B, F1OWLEN DOPA-15BHFS, F1OWLEN DOPA-22, F1OWLEN DOPA-33, F1OWLEN DOPA-44, F1OWLEN DOPA-17HF, F1OWLEN TG-662C, and F1OWLEN KTG-2400 (manufactured by KYOEISHA CHEMICAL Co., LTD. up to here), ED-117, ED-118, ED-212, ED-213, ED-214, ED-216, ED-350, and ED-360 (manufactured by Kusumoto Chemicals, Ltd. up to here), PLYSURF M208F, PLYSURF DBS (manufactured by DKS Co. Ltd. up to here), and the like. These products may be used alone, or a plurality of these products may be mixed for use.

The required amount of the dispersing agent is proportionate to the amount of copper oxide and adjusted considering the required dispersion stability. The mass ratio of the dispersing agent contained in the dispersing element of the embodiment (dispersing agent mass/copper oxide mass) is from 0.0050 or more to 0.30 or less, preferably 0.050 or more to 0.25 or less, and more preferably 0.10 or more to 0.23 or less. The amount of the dispersing agent affects the dispersion stability, the small amount of the dispersing agent is likely to aggregate, and the large amount of the dispersing agent tends to improve the dispersion stability. Note that when a content proportion of the dispersing agent in the dispersing element of the embodiment is designed to be 35 mass % or less, an influence from a residue derived from the dispersing agent in the conductive film obtained by firing is reduced and the conductive property can be improved.

The dispersing agent preferably has the acid value (mgKOH/g) of 20 or more to 130 or less. The acid value is more preferably 30 or more to 100 or less. The acid value in this range is excellent in dispersion stability and therefore is preferred. Such dispersing agent is especially effective in the case of the copper oxide having the small average particle diameter. Specifically, the dispersing agent includes "DISPERBYK-102" (acid value: 101), "DISPERBYK-140" (acid value: 73), "DISPERBYK-142" (acid value: 46), "DISPERBYK-145" (acid value: 76), "DISPERBYK-118" (acid value: 36), "DISPERBYK-180" (acid value: 94) manufactured by BYK, and the like.

A difference between an amine value (mgKOH/g) and the acid value of the dispersing agent (amine value−acid value) is preferably −50 or more to 0 or less. The amine value indicates a total amount of a free base and a base, and the acid value indicates a total amount of free fatty acid and fatty acid. The amine value and the acid value are measured by a method compliant with JIS K 7700 or ASTM D2074. The difference of −50 or more to 0 or less is excellent in dispersion stability and therefore is preferred, −40 or more to 0 or less is more preferred, and −20 or more to 0 or less is further preferred.

[Reductant]

The following describes the reductant. The reductant includes hydrazine, hydrazine hydrate, sodium, carbon, potassium iodide, oxalic acid, iron sulfide (II), sodium thiosulfate, ascorbic acid, tin chloride (II), diisobutylaluminium hydride, formic acid, sodium borohydride, sulfite, and the like. From perspectives of contribution to reduction of copper oxide, especially cuprous oxide, in firing, and ensuring manufacturing a copper film having further low resistance, the use of hydrazine or hydrazine hydrate as the reductant is the most preferable. The use of hydrazine or hydrazine hydrate can maintain the dispersion stability of the dispersing element and can reduce the resistance of the copper film.

The required amount of the reductant is proportionate to the amount of the copper oxide and adjusted considering the required reducibility. The mass ratio of the reductant contained in the dispersing element of the embodiment (reductant mass/copper oxide mass) is preferably 0.0001 or more to 0.10 or less, more preferably 0.0001 or more to 0.05 or less, and further preferably 0.0001 or more to 0.03 or less. The mass ratio of the reductant of 0.0001 or more improves the dispersion stability and decreases the resistance of the copper film. The mass ratio of 0.10 or less improves the long-term stability of the dispersing element.

[Dispersion Medium]

The dispersing element of the embodiment may contain the dispersion medium (solvent) in addition to the above-described components.

The dispersion medium used for the dispersing elements according to the first to the third embodiments are preferably at least one kind selected from the group consisting of terpineol, γ-butyrolactone, cyclohexanone, ethanol, propylene glycol, butanol, propanol, ethylene glycol monoethyl ether acetate and tetralin. Containing two or more kinds of these dispersion mediums are more preferred.

Since these dispersion mediums have high boiling points, an effect of improvement in print continuity is provided. While these dispersion mediums may have a reduction action, when the above-described reductant is contained in the dispersing element, the reductant serves as a dispersion medium.

As the dispersion mediums used for the first to the third embodiments, one that can dissolve the dispersing agent is selected from a perspective of dispersion. Meanwhile, from a perspective of forming the conductive pattern using the dispersing element, since volatility of the dispersion medium affects work efficiency, the dispersion medium needs to be suitable for the method for forming the conductive pattern, for example, printing and application methods. Therefore, the dispersion medium is selectable from the following solvents according to dispersibility and the work efficiencies of the printing and the application.

Specific examples of the dispersion medium can include the following solvents. Propylene glycol monomethylether acetate, 3-methoxy-3-methyl-butyl acetate, ethoxyethyl propionate, propylene glycol monomethyl ether, propylene glycol monoethyl ether, propylene glycol monopropyl ether, propylene glycol tertiary butyl ether, dipropylene glycol monomethyl ether, ethylene glycol butyl ether, ethylene glycol ethyl ether, ethylene glycol methyl ether, ethylene glycol, 1,2-propylene glycol, 1,3-butylene glycol, 2-pentanediol, 2-methylpentane-2,4-diol, 2,5-hexanediol, 2,4-heptanediol, 2-ethylhexane-1,3-diol, diethylene glycol, hexanediol, octanediol, triethylene glycol, tri-1,2-propylene glycol, glycerol, ethylene glycol monohexyl ether, diethylene glycol monoethyl ether, diethylene glycol monobutyl ether, ethylene glycol monobutyl acetate, diethylene glycol monoethyl ether acetate, methanol, ethanol, n-propanol, i-propanol, n-butanol, i-butanol, 2-butanol, t-butanol, n-pentanol, i-pentanol, 2-methyl butanol, 2-pentanol, t-pentanol, 3-methoxy butanol, n-hexanol, 2-methylpentanol, 1-hexanol, 2-hexanol, 2-ethyl-butanol, 1-heptanol, 2-heptanol, 3-heptanol, n-octanol, 2-ethylhexanol, 2-octanol, n-nonylalcohol, 2,6-dimethyl-4-heptanol, n-decanol, cyclohexanol, methylcyclohexanol, 3,3,5-trimethylcyclohexanol, benzyl alcohol, diacetone alcohol, and the like. Except for these specifically described substances, alcohol, glycol, glycol ether, and glycol esters solvents are usable as the dispersion medium. These substances may be used alone or a plurality of these substances may be mixed for use. The substance is selected in consideration of vaporizability, print machinery, and solvent resistance of a printed board according to the printing method.

As the dispersion medium, monoalcohol with ten carbons or less is more preferred and eight carbons or less is further preferred. Among monoalcohols with eight carbons or less, ethanol, n-propanol, i-propanol, n-butanol, i-butanol, sec-butanol, and t-butanol are especially suitable in dispersibility, volatility, and viscosity and therefore are further preferred. These monoalcohols may be used alone or a plurality of these monoalcohols may be mixed for use. To reduce the decrease in dispersibility of the copper oxide and for further stable dispersion by an interaction with the dispersing agent, the monoalcohol with eight carbons or less is preferred. Additionally, the selection of eight carbons or less decreases the resistance value and therefore is preferred.

However, the boiling point affects the work efficiency of the solvent. The excessively low boiling point makes the volatilization fast; therefore, due to an increase in defect and an increase in cleaning frequency caused by precipitation of a solid material, the work efficiency is deteriorated. In view of this, the boiling point 40° C. or more is preferred in the application and the dispenser method, the boiling point 120° C. or more is preferred in the inkjet method, the screen method, and the offset method, 150° C. or more is more preferred, 200° C. or more is further preferred, and as the upper limit of the boiling point, 300° C. or less is preferred from the perspective of drying.

[Preparation of Dispersing Element Containing Copper Oxide and Copper]

The dispersing element containing the cuprous oxide and the copper particle, namely, the dispersing element can be prepared as follows. Copper microparticles and, as necessary, a dispersion medium are mixed with the above-described copper oxide dispersing element at respective predetermined proportions, and a dispersion process is performed using, for example, mixer method, ultrasonic wave method, three-roll method, two-roll method, attritor, homogenizer, banbury mixer, paint shaker, kneader, ball mill, sand mill, rotary and revolutionary mixer, or the like.

Since the dispersion medium is partially contained in the already generated copper oxide dispersing element, in the case where the dispersion medium is sufficient by the amount contained in this copper oxide dispersing element, the dispersion medium needs not to be added in this step, and the dispersion medium only needs to be added in this step as necessary when the viscosity needs to decrease. Alternatively, the dispersion medium may be added after this step. The dispersion medium identical to one added during the manufacturing of the above-described copper oxide dispersing element or different from the one may be added.

Besides, according to need, an organic binder, antioxidant, reductant, metal particles, or metal oxide may be added, and as impurities, metal, metal oxide, metal salt, and metal complex may be contained.

Since the wire-shaped, the dendritic-shaped, or the scaly-shaped copper particles provide the large crack preventing effect, the copper particles may be used alone or may be added in combination with a plurality of copper particles having spherical shapes, cubic shapes, polyhedron shapes, or the like and another metal, and their surfaces may be coated with oxide or another metal having a good conductive property, for example, silver.

In the case where one kind or a plurality of metal particles other than copper having the wire shapes, the dendritic shapes, and the scaly shapes are added, to provide the crack preventing effect similarly to the copper particles having the similar shapes, the metal particles can be substituted for a part of the copper particles having the similar shapes or added to the copper particles having the similar shapes for use; however, a migration, a particle strength, a resistance value, copper leaching, formation of an intermetallic compound, a cost, and the like need to be considered. Examples of the metal particles other than copper can include gold, silver, tin, zinc, nickel, platinum, bismuth, indium, and antimony.

As the metal oxide particles, the cuprous oxide can be substituted by oxidized silver, cupric oxide, or the like, or they can be added for use. However, similarly to the case of the metal particles, a migration, a particle strength, a resistance value, copper leaching, formation of an intermetallic compound, a cost, and the like need to be considered. The additions of these metal particles and metal oxide particles are usable for adjustments of the sintering, the resistance, the conductor strength, absorbance during firing with light of the conductive film, and the like. Even when these metal particles and metal oxide particles are added, the presence of the wire-shaped, the dendritic-shaped, or the scaly-shaped copper particles sufficiently reduces cracks. These metal particles and metal oxide particles may be used alone or in a combination of two kinds of more, and the shapes are not restricted. For example, silver and oxidized silver are expected to bring effects, such as the decrease in resistance and the decrease in firing temperature.

However, from perspectives of an increase in cost of the silver as noble metals and the prevention of cracks, the additive amount of the silver is preferably in a range not exceeding those of the wire-shaped, the dendritic-shaped, or the scaly-shaped copper particles. Additionally, since tin is a low price and has a low melting point, tin is advantageous in its ease of sintering. However, tin tends to increase the resistance and from the perspective of crack prevention, the additive amount of the tin is preferably in a range not exceeding those of the wire-shaped, dendritic-shaped, or scaly-shaped copper particles and the cuprous oxide. In a method using light and infrared, such as a flash lamp and laser, cupric oxide acts as light absorber and heat ray absorbent. However, from perspectives that cupric oxide is less likely to be reduced compared with cuprous oxide and a peeling from the board caused by much gas generation during reduction is prevented, the additive amount of the cupric oxide is preferably smaller than that of the cuprous oxide.

In the embodiment, even when metal other than copper, copper particles having shapes other than wire shapes, dendritic shapes, and scaly shapes, or metal oxide other than copper oxide is contained, the crack preventing effect and the effect of improvement in stability of resistance over time are provided. However, the additive amounts of the metal other than copper, the copper particles having the shapes other than the wire shapes, the dendritic shapes, and the scaly shapes, and the metal oxide other than copper oxide are preferably smaller than those of the copper particles having the wire shapes, the dendritic shapes, and the scaly shapes, and the copper oxide. Additionally, proportions of adding the metal other than copper, the copper particles having the shapes other than the wire shapes, the dendritic shapes, and the scaly shapes, and the metal oxide other than copper oxide to the wire-shaped, the dendritic-shaped, or the scaly-shaped copper particles and the copper oxide are 50% or less, more preferably 30% or less, and further preferably 10% or less.

[Details of Structure with Conductive Pattern]

The following specifically describes each configuration of the structure with the conductive pattern 10 according to the embodiment. Note that each configuration is not limited to specific examples described below.

The method for manufacturing the structure with the conductive pattern according to the embodiment includes a step of applying the dispersing element according to the embodiment over the board to form the application film and a step of irradiating the application film with laser light to form the conductive pattern on the board.

The method for manufacturing the structure with the conductive pattern according to the embodiment includes a step of applying the dispersing element over the board in a desired pattern to form the application film and a step of performing the firing process on the application film to form the conductive pattern on the board. The method according to the embodiment allows directly forming the desired pattern on the board with application liquid; therefore, compared with the conventional method of using a photoresist, productivity can be improved.

[Application Method of Dispersing Element over Board]

The following describes the application method using the copper oxide ink as the dispersing element. The application method is not specifically limited, and a printing method, such as an aerosol method, a screen-printing, direct intaglio printing, intaglio offset printing, flexography, and offset printing, a dispenser drawing method, and the like are usable. The application method, such as a die coat, a spin coat, a slit coat, a bar coat, a knife coat, a spray coat, and a dip coat are usable.

[Board]

The board used in the embodiment has a surface forming the application film and may have a plate shape or may be a three-dimensional object. The board in the embodiment means a board material of a circuit board sheet to form a wiring pattern, a casing material of a casing with wiring, or the like. Examples of the casing include a casing for an electrical device, such as a mobile phone terminal, a smart phone, smart glasses, a television, and a personal computer. Other examples of the casing in the automotive field include a dashboard, an instrument panel, a steering wheel, a chassis, and the like.

The board used for the embodiment is not specifically limited and made of an inorganic material or an organic material.

Examples of the inorganic material include a glass, such as a soda lime glass, a non-alkali glass, a borosilicate glass, and a quartz glass, and a ceramic material, such as alumina.

The organic material includes a high-polymer material, a paper, and the like. As the high-polymer material, a resin film is usable. The resin film can include polyimide (PI), polyethylene terephthalate (PET), polyethersulfone (PES), polyethylene naphthalate (PEN), polyester, polycarbonate (PC), polyvinyl alcohol (PVA), polyvinyl butyral (PVB), polyacetal (POM), polyarylate (PAR), polyamide (PA), polyamide imide (PAI), polyetherimide (PEI), polyphenylene ether (PPE), modified-polyphenyleneether (m-PPE), polyphenylene sulfide (PPS), polyether ketone (PEK), polyphthalamide (PPA), polyether nitrile (PEN), polybenzimidazole (PBI), polycarbodiimide, polysiloxane, polymethacrylamide, nitrile rubber, acrylic rubber, polyethylene tetrafluoride, epoxy resin, phenolic resin, melamine resin, urea resin, polymethyl methacrylate (PMMA), polybutene, polypentene, ethylene-propylene copolymer, ethylene-butenediene copolymer, polybutadiene, polyisoprene, ethylene-propylene-diene copolymer, butyl rubber, polymethylpentene (PMP), polystyrene (PS), styrene-butadiene copolymer, polyethylene (PE), polyvinyl chloride (PVC), polyvinylidene fluoride (PVDF), polyether ether ketone (PEEK), phenolic novolac, benzocyclobutene, polyvinylphenol, polychloroprene, polyoxymethylene, polysulfone (PSF), polyphenyl sulfone resin (PPSU), cycloolefin polymer (COP), acrylonitrile butadiene styrene resin (ABS), acrylonitrile styrene resin (AS), nylon resin (PA6, PA66), polybutylene terephthalate resin (PBT), polyether sulfone resin (PESU), polytetrafluoroethylene resin (PTFE), polychlorotrifluoroethylene (PCTFE), silicone resin, and the like. Especially, PI, PET, and PEN are preferred from perspectives of flexibility and a cost.

The paper includes a western paper, such as a high-quality paper, a medium-quality paper, a coated paper, a cardboard, and a corrugated cardboard using general pulp as a raw material, and a paper using cellulose nanofiber as a raw material. In the case of the paper, a paper produced by dissolving a high-polymer material or a paper produced by impregnating and hardening a sol-gel material is usable. These materials may be used by pasting, such as lamination. Examples of the paper include a composite base material, such as a paper phenol base material, a paper epoxy base material, a glass composite base material, and a glass epoxy base material, a Teflon (registered trademark) base material, an alumina base material, Low Temperature and Low-humidity Co-fired Ceramics (LTCC), a silicon wafer, and the like.

The board can be designed to have a thickness of, for example, 1 µm to 10 mm, and 25 µm to 250 µm is preferred. The board having the thickness of 250 µm or less allows a weight reduction of a manufactured electronic device, space saving, and flexibility and therefore is preferred. With the board being a casing, its thickness can be designed to be, for example, 1 µm to 10 mm, and 200 µm to 5 mm is preferred. It has become apparent by the inventors that selecting this range develops the mechanical strength and the heat resistance after molding.

[Formation of Conductive Pattern]

The method for forming the conductive pattern includes 1) a method of manufacturing a pattern using the above-described printing method and then firing the pattern and 2) a method that coats the dispersing element over the whole surface of the board and manufactures a pattern there so as to be a specific pattern by laser drawing. In both 1) and 2), a part of the copper oxide is not reduced but remains on the board side and this improves adhesiveness between the conductive pattern and the board, and this is preferred. The conductive pattern is a wiring, and having the wiring width of 0.5 µm or more to 10000 µm or less is preferred, 1 µm or more to 1000 µm or less is more preferred, and 1 µm or more to 500 µm or less is further preferred. The conductive pattern may be formed into a mesh shape. The mesh shape refers to wiring in a grid shape that increases transmittance and becomes transparent and therefore is preferred.

[Firing of Dispersing Element]

As long as the conductive film that provides the effects of the present invention can be formed, the method for the firing process is not specifically limited, and the specific examples include a method of using an incinerator, a plasma firing method, a light firing method, and the like. In the laser irradiation in the light firing, the application film is formed with the copper oxide ink as the dispersing element and the application film is irradiated with laser, thus ensuring performing the firing of the copper particles and patterning at once. Another firing method prints a desired pattern with the dispersing element and fires the desired pattern, thus ensuring obtaining the conductive pattern. When the conductive pattern is manufactured, a part of the cuprous oxide is not reduced but remains on the contact surface with the board, and this improves the adhesiveness between the conductive pattern and the board and therefore is preferred.

[Kiln]

In the embodiment, the firing method using the kiln reduces the copper oxide into the copper and sinters the copper and therefore fires the application film by heat at 100° C. or more, preferably 150° C. or more, and more preferably 200° C. or more.

The method of firing with the kiln or the like, which is likely to be affected by oxygen, preferably processes the application film of the dispersing element under a non-oxidizing atmosphere. In the case where the copper oxide is less likely to be reduced only by the organic component contained in the dispersing element, firing under a reducing atmosphere is preferred. The non-oxidizing atmosphere is an atmosphere not containing oxidized gas, such as oxygen, for example, an atmosphere filled with inert gas, such as nitrogen, argon, helium, and neon. While the reducing atmosphere refers to an atmosphere where reducing gas, such as hydrogen or carbon monoxide, is present, the reducing gas may be used mixed with inert gas. The application film of the dispersing element may be fired with the inside of the sealed kiln filled with these gases or while the gases are continuously flown into the kiln. The firing may be performed under a pressurized atmosphere or a depressurized atmosphere.

[Plasma Firing Method]

Compared with the method using the kiln, the plasma method of the embodiment allows the process at a lower temperature, and is one of a better method as the firing method in the case of the use of a resin film having low heat resistance as a base material. Since the organic matter and the oxide film on the pattern surface are removable by plasma, this method is also advantageous in that a satisfactory soldering performance can be ensured. Specifically, the method flows reducing gas or mixed gas of reducing gas and inert gas into a chamber, generates plasma with a microwave, and uses active species generated by this as a heating source necessary for reduction or sintering and further decomposition of the organic matter contained in the dispersing agent and the like to obtain the conductive film.

Especially in the metal part, deactivation of the active species is large, the metal part is selectively heated, and the temperature of the board itself is less likely to increase, the plasma firing method is applicable to a resin film as the board. The dispersing element contains the copper as metal, and as the firing proceeds, the copper oxide changes into the copper; therefore, the heating is promoted in only the pattern part. When the organic matter in the dispersing agent or the binder component remains in the conductive pattern, while the organic matter hinders the sintering and the resistance tends to increase, the plasma method has a large effect of removing the organic matter in the conductor pattern. The plasma method can remove the organic matter and the oxide film on the surface of the application film and therefore is advantageous in that the soldering performance of the conductive pattern can be effectively improved.

As the reducing gas component, hydrogen and the like, and as the inert gas component, nitrogen, helium, argon, and the like are usable. These substances may be used alone or the reducing gas component and the inert gas component may be mixed at any proportion for use. Additionally, two or more kinds of the inert gas components may be mixed for use.

The plasma firing method can adjust a microwave input power, an introduced gas flow rate, a chamber internal pressure, a distance from a plasma generation source to a process sample, a process sample temperature, and processing time, and adjustment of these items can change intensity of the process. Therefore, needless to say about a board of an inorganic material, achieving the optimization of the adjustment items allows using a thermosetting resin film of an organic material, a paper, a thermoplastic resin film having a low heat resistance, for example, PET and PEN as the board, and the conductive film having the low resistance can be obtained. Note that the optimal conditions differ depending on the device structure and a kind of the sample and therefore are adjusted according to the situation.

[Light Firing Method]

As the light firing method of the embodiment, a flash light method using a discharge tube of, for example, xenon as the light source and a laser light method are applicable. These methods are methods that expose the dispersing element with light at a large intensity for a short period to increase the temperature of the dispersing element applied over the board to be a high temperature in a short period and fires the dispersing element, and are methods that reduce the copper oxide, sinter the copper particles, integrate the copper oxide and the copper particles, and decompose the organic component to form the conductive film. Because of the short firing period, the methods are methods in which damage to the board is small and are applicable to a resin film board having a low heat resistance.

The flash light method is a method that instantly discharges electric charges stored in a condenser using the xenon discharge tube, generates a large amount of pulse light, and irradiates the dispersing element formed on the board with the pulse light to instantly heat the copper oxide at a high temperature and changes the copper oxide into the conductive film. The amount of exposure is adjustable by optical intensity, a light emission period, a light irradiation interval, and the number of times. When optical transparency of the board is large, the conductive pattern with the dispersing element can be formed on the resin board having the low heat resistance, such as PET and PEN, a paper, and the like.

Although the light emission source differs, the use of the laser light source allows obtaining the similar effects. In the case of laser, in addition to the adjustment items of the flash light method, a wavelength is freely selected, and is selectable in consideration of an optical absorption wavelength of the dispersing element with which the pattern is formed and an absorption wavelength of the board. Additionally, an exposure by beam scan is possible, and this method features in that the exposure range is easily adjusted, such as a selection of an exposure to the whole board surface or a partial exposure. As the kinds of the laser, yttrium•aluminum•garnet (YAG), yttrium vanadate (YVO), ytterbium (Yb), semiconductor laser (GaAs, GaAlAs, GaInAs), carbonic acid gas, and the like are usable. Not only a fundamental wave, higher harmonics may be extracted as necessary for use.

Especially, in the case of using laser light, its emission wavelength is preferably 300 nm or more to 1500 nm or less. For example, 355 nm, 405 nm, 445 nm, 450 nm, 532 nm, 1056 nm, and the like are preferred. For the board and the casing made of resin, a laser wavelength of 355 nm, 405 nm, 445 nm, 450 nm, and 532 nm are especially preferred in terms of an absorption region of the copper-oxide-containing layer of the embodiment. The use of the laser allows freely manufacturing a desired pattern into a plane and a solid body.

The surface roughness of the surface of the conductive layer or the conductive pattern is preferably 500 nm or more to 4000 nm or less, more preferably 750 nm or more to 3000 nm or less, and further preferably 1000 nm or more to 2000 nm or less. The surface roughness in this range facilitates adhesion of the solder layer on the conductive pattern and increases the adhesiveness between the conductive pattern and the solder layer.

[Formation of Solder Layer to Conductive Pattern]

In the structure with the conductive pattern manufactured using the dispersing element according to the embodiment, the dispersing agent and the dispersion medium, which degrade the soldering performance, are decomposed in the step of the firing process; therefore, the structure with the conductive pattern is advantageous in that when a bonded body (for example, an electronic component or the like) is soldered to the conductive pattern, adhesion of the melted solder is facilitated. Here, the solder is alloy mainly containing lead and tin and includes lead-free solder not containing lead. The conductive pattern according to the embodiment includes the hollow wall (void). Accordingly, the entrance of the solder into this void increases the adhesiveness between the conductive pattern and the solder layer.

The grain sizes of the coppers contained in the conductive pattern and the conductive layer are preferably 0.1 μm or more to 100 μm or less, further preferably 0.5 μm or more to 50 μm or less, and especially preferably 1.0 μm or more to 10 μm or less. This increases the adhesiveness between the conductive pattern and the solder layer.

In the embodiment, the electronic component is at least one kind among an active component, such as a semiconductor, an integrated circuit, a diode, and a liquid crystal display, a passive component, such as a resistor and a capacitor, and a mechanism component, such as a connector, a switch, an electric wire, a heat sink, and an antenna.

The solder layer is formed to the conductive pattern preferably by a reflow method. The reflow method solders by first applying a solder paste (solder cream) on the surface of a part of the conductive pattern region formed in (j) of FIG. 3 and (l) of FIG. 4, for example, a land. The solder paste is applied by, for example, contact printing using a metal mask and a metal squeegee. This forms the solder layer on a part of the surface of the conductive pattern. That is, after the step of (j) of FIG. 3, the structure with the conductive pattern in which the solder layer is formed on a part of the surface of the conductive pattern in the superficial layer is obtained. After the step of (l) of FIG. 4, the structure with the conductive pattern in which the solder layer is formed on a part of the surface of the conductive pattern is obtained. An area of a part of the surface of the conductive pattern on which the solder layer is formed is not specifically limited, and the area only needs to be an area that the conductive pattern can be bonded to the electronic component.

(Bonding of Electronic Component)

Figure 9A:
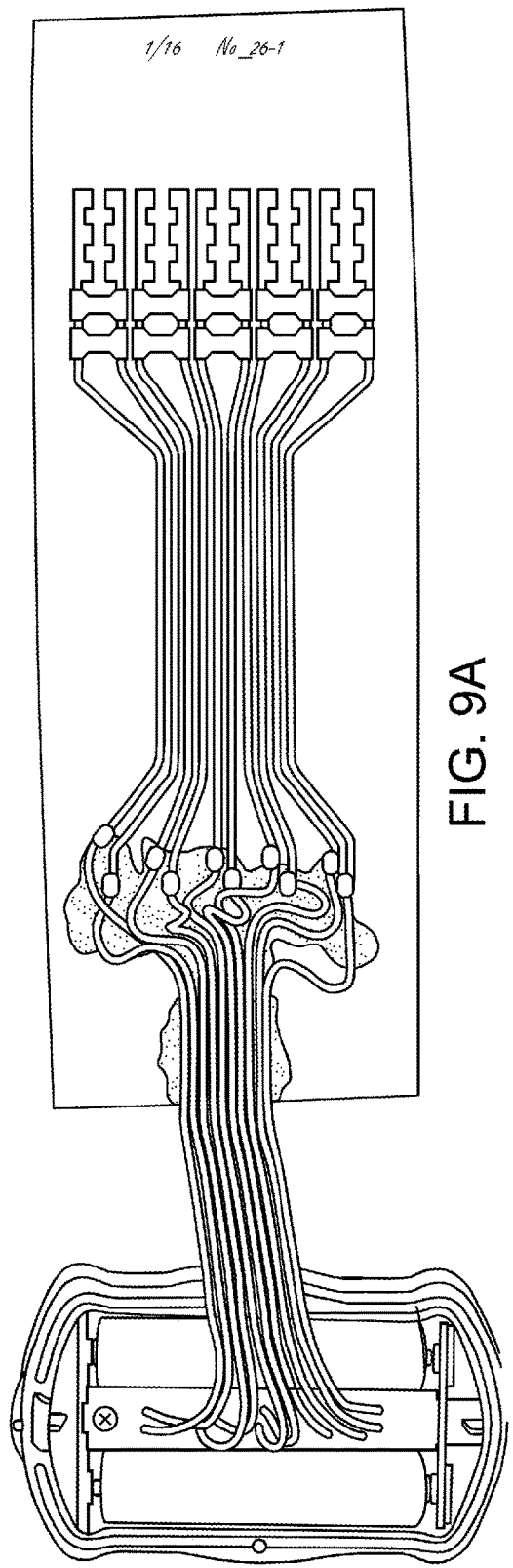
FIG. 9 is a top view of the structure with the conductive pattern on which solder layers according to the embodiment are formed.
Figure 9B:
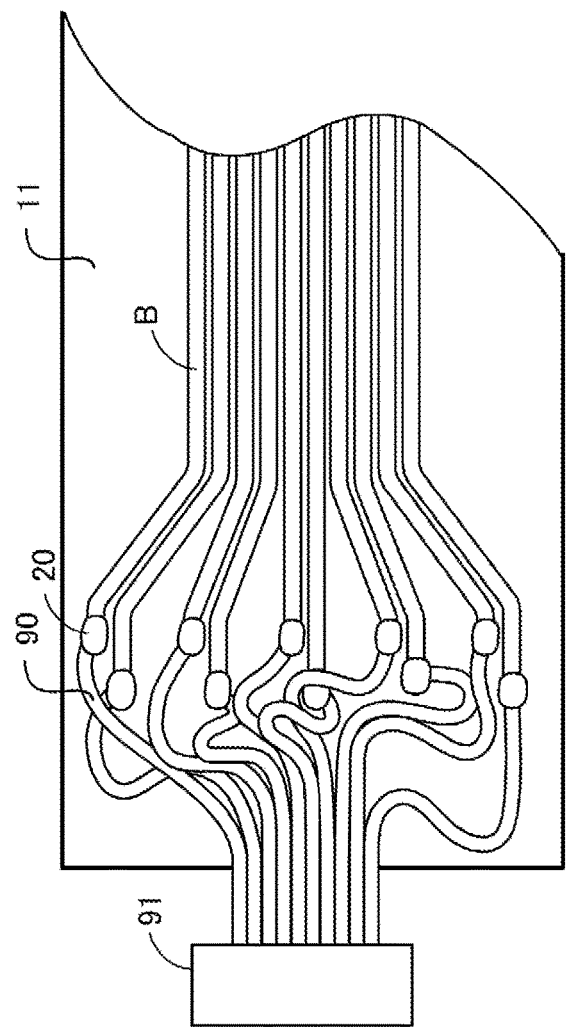

Next, the electronic component is placed on the conductive board such that the bonded portion of the electronic component is brought into contact with a part of the applied solder paste (solder layer). Afterwards, the conductive board on which the electronic component is placed is passed through a reflow furnace for heating, and a part of the conductive pattern region (such as the land) and the bonded portion of the electronic component are soldered. FIG. 9 is a top view of the structure with the conductive pattern on which the solder layers according to the embodiment are formed. FIG. 9A is a photograph of the structure with the conductive pattern on which the solder layers are formed, and FIG. 9B illustrates a schematic diagram of the structure with the conductive pattern.

As illustrated in FIG. 9, on the board 11 having flexibility, a conductive pattern B formed by firing the copper oxide ink as the dispersing element is formed. Solder layers 20 are formed on the surface of the conductive pattern B. The solder layer 20 appropriately solders the conductive pattern B and a conducting wire 90, and the conductive pattern B and an electronic component 91 are appropriately coupled via the conducting wire 90.

The method for manufacturing the structure with the conductive pattern according to the embodiment fires the copper oxide ink as the dispersing element to form the conductive pattern; therefore, the organic binder contained in the dispersing element is decomposed. Accordingly, the obtained conductive pattern increases the wettability of the solder, and this allows easily forming the solder layer on the surface of the conductive pattern. In view of this, the electronic component can be soldered. Consequently, a failure of the solder layer, which bonds the conductive pattern region and the bonded portion of the electronic component, is prevented, and the structures with the conductive patterns to which the electronic component are soldered can be manufactured at a high yield.

Additionally, with the method for manufacturing the structure with the conductive pattern according to the second embodiment, the application film formed using the dispersing element containing copper oxide particles having the particle diameter of 1 nm or more to 50 nm or less, the copper particles having the particle diameters of 0.1 μm or more to 100 μm or less, and the organic compound having the phosphate group exhibits the high wettability of the solder. This allows reducing a state where, after the metal surface is coated with the melted solder, the solder shrinks, and a considerably thin part is formed in the solder, namely, dewetting. Consequently, a failure of the solder bonding portion bonded to the conductive film and the bonded portion of the electronic component can be prevented and the boards with the electronic components can be manufactured at a high yield.

WORKING EXAMPLES

While the following further specifically describes the present invention through working examples and comparative examples, the present invention is not limited to these working examples and comparative examples.

Experimental Example 1

[Hydrazine Quantitative Method]

Hydrazine was quantitated by standard addition method.

Hydrazine of 33 μg, a surrogate substance (hydrazine $^{15}N_2H_4$) of 33 μg, and acetonitrile solution with 1% of benzaldehyde of 1 ml were added to a sample (copper nano ink) of 50 μL. Finally, phosphoric acid of 20 μL was added, and GC/MS measurement was performed after the elapse of four hours.

Similarly, hydrazine of 66 μg, a surrogate substance (hydrazine $^{15}N_2H_4$) of 33 μg, and acetonitrile solution with 1% of benzaldehyde of 1 ml were added to a sample (copper nano ink) of 50 μL. Finally, phosphoric acid of 20 μL was added, and GC/MS measurement was performed after the elapse of four hours.

Similarly, hydrazine of 133 μg, a surrogate substance (hydrazine $^{15}N_2H_4$) of 33 μg, and acetonitrile solution with 1% of benzaldehyde of 1 ml were added to a sample (copper nano ink) of 50 μL. Finally, phosphoric acid of 20 μL was added, and GC/MS measurement was performed after the elapse of four hours.

Finally, without adding hydrazine, a surrogate substance (hydrazine $^{15}N_2H_4$) of 33 μg and acetonitrile solution with 1% of benzaldehyde of 1 ml were added to a sample (copper nano ink) of 50 μL. Finally, phosphoric acid of 20 μL was added, and GC/MS measurement was performed after the elapse of four hours.

A peak area value of the hydrazine was obtained from a chromatogram of m/z=207 of the GC/MS measurements of the four samples. Next, the peak area value of the surrogate was obtained from mass chromatogram of m/z=209. A weight of the added hydrazine/weight of the added surrogate substance was plotted on an x-axis and the peak area value of hydrazine/peak area value of the surrogate substance was plotted on a y-axis to obtain a calibration curve by standard addition method.

A value of a Y intercept obtained from the calibration curve was divided by the weight of the added hydrazine/weight of the added surrogate substance to obtain the weight of hydrazine.

[Particle Diameter Measurement]

Using FPAR-1000 manufactured by OTSUKA ELECTRONICS, an average secondary particle diameter of the copper oxide ink as the dispersing element was measured by cumulant method.

Working Example 1

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by an external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 54.8 g, SURFLON 5611 (manufactured by SEIMI CHEMICAL) of 13.7 g, and ethanol (manufactured by KANTO CHEMICAL CO., INC.) of 907 g were added to the obtained precipitate of 390 g. The precipitate was dispersed using a homogenizer to obtain cuprous oxide dispersion liquid (copper oxide ink) of 1365 g.

The dispersion liquid was properly dispersed. The content proportion of the cuprous oxide was 20%, and the average secondary particle diameter was 22 nm. The hydrazine proportion was 3000 ppm.

Working Example 2

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by the external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 54.8 g, SURFLON 5611 (manufactured by SEIMI CHEMICAL) of 13.7 g, and ethanol (manufactured by KANTO CHEMICAL CO., INC.) of 907 g were added to the obtained precipitate of 390 g. The precipitate was dispersed using the homogenizer to obtain cuprous oxide dispersion liquid of 1365 g. Further, the dispersion liquid was bubbled with air.

The dispersion liquid was properly dispersed. The content proportion of the cuprous oxide was 20%, and the average secondary particle diameter was 25 nm. The hydrazine proportion was 700 ppm.

Working Example 3

Hydrazine (manufactured by Tokyo Chemical Industry Co., Ltd.) of 1.5 g was put in the dispersion liquid of 98.5 g obtained in Working Example 1.

The dispersion liquid was properly dispersed. The content proportion of the cuprous oxide was 20%, and the average secondary particle diameter was 29 nm. The hydrazine proportion was 18000 ppm.

Working Example 4

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by the external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 1.37 g, SURFLON 5611 (manufactured by SEIMI CHEMICAL) of 13.7 g, and ethanol (manufactured by KANTO CHEMICAL CO., INC.) of 960 g were added to the obtained precipitate of 390 g. The precipitate was dispersed using a homogenizer to obtain cuprous oxide dispersion liquid (copper oxide ink) of 1365 g.

The dispersion liquid was properly dispersed. The content proportion of the cuprous oxide was 20%, and the average secondary particle diameter was 32 nm. The hydrazine proportion was 3000 ppm.

Working Example 5

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by the external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 82.2 g, SURFLON 5611 (manufactured by SEIMI CHEMICAL) of 13.7 g, and ethanol (manufactured by KANTO CHEMICAL CO., INC.) of 880 g were added to the obtained precipitate of 390 g. The precipitate was dispersed using the homogenizer to obtain cuprous oxide dispersion liquid (copper oxide ink) of 1365 g.

The dispersion liquid was properly dispersed. The content proportion of the cuprous oxide was 20%, and the average secondary particle diameter was 32 nm. The hydrazine proportion was 3000 ppm.

Comparative Example 1

Cuprous oxide (MP-Cu2O-25 manufactured by EM Japan) of 4 g, DisperBYK-145 (manufactured by BYK) of 0.8 g, and SURFLON 5611 (manufactured by SEIMI CHEMICAL) of 0.2 g were added to ethanol (manufactured by KANTO CHEMICAL CO., INC.) of 15 g, and the product was dispersed using the homogenizer to obtain cuprous oxide dispersion liquid of 20 g.

It was observed that the copper oxide particles were partially aggregated in the dispersion liquid. The content proportion of the cuprous oxide was 20%, and the average secondary particle diameter was 190 nm. The hydrazine proportion was 0 ppm.

Comparative Example 2

Hydrazine (manufactured by Tokyo Chemical Industry Co., Ltd.) of 3 g was put in the dispersion liquid of 97 g obtained in Working Example 1.

The copper oxide particles were aggregated in the dispersion liquid, failing to produce ink. The content proportion of the cuprous oxide was 20%. The hydrazine proportion was 33000 ppm.

Comparative Example 3

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by the external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 0.82 g, SURFLON 5611 (manufactured by SEIMI CHEMICAL) of 13.7 g, and ethanol (manufactured by KANTO CHEMICAL CO., INC.) of 960 g were added to the obtained precipitate of 390 g. The precipitate was dispersed using the homogenizer to obtain cuprous oxide dispersion liquid (copper oxide ink) of 1365 g.

The copper oxide particles were aggregated in the dispersion liquid, failing to produce ink. The content proportion of the cuprous oxide was 20%. The hydrazine proportion was 3000 ppm.

Comparative Example 4

Copper acetate (II)-hydrate (manufactured by KANTO CHEMICAL CO., INC.) of) 806 g was dissolved in mixed solvent of distilled water (manufactured by KYOEI PHARMACEUTICAL CO., LTD.) of 7560 g and 1,2-propylene glycol (manufactured by KANTO CHEMICAL CO., INC.) of 3494 g, and the liquid temperature was set to −5° C. by the external temperature controller. Hydrazine-hydrate (manufactured by Tokyo Chemical Industry Co., Ltd.) of 235 g was added to the obtained solution for 20 minutes and stirred for 30 minutes. After that, the liquid temperature was set to 25° C. by the external temperature controller and the solution was stirred for 90 minutes. After the stirring, the obtained dispersion liquid was separated into supernatant and precipitate by centrifugation. DisperBYK-145 (manufactured by BYK) of 110 g, SURFLON 5611 (manufactured by SEIMI CHEMICAL) of 13.7 g, and ethanol (manufactured by KANTO CHEMICAL CO., INC.) of 851 g were added to the obtained precipitate of 390 g. The precipitate was dispersed using the homogenizer to obtain cuprous oxide dispersion liquid (copper oxide ink) of 1365 g.

The copper oxide particles were aggregated in the dispersion liquid, failing to produce ink. The content proportion of the cuprous oxide was 20%. The hydrazine proportion was 3000 ppm.

[Reverse Printing]

Using copper oxide ink, a patterned application film was formed on a board by reverse printing. First, the application film of copper oxide ink was formed at a uniform thickness on a surface of a blanket (transfer body). A material of the surface of the blanket is usually made of silicone rubber. Whether the copper oxide ink was properly attached to this silicone rubber and the uniform application film was formed were confirmed. Next, the surface of the blanket on which the application film of the copper oxide ink was formed was pressed against and brought into contact with a letterpress plate, and a part of the application film of the copper oxide ink on the blanket surface was attached to and transferred to surfaces of convex portions of the letterpress plate. Thus, a print pattern was formed on the application film of the copper oxide ink remaining on the surface of the blanket. Next, the blanket in this state was pressed against the surface of the printed board to transfer the application film of the copper oxide ink remaining on the blanket, and thus the patterned application film was formed. The evaluation criteria are as follows.

A: The reverse printing was able to be performed.
B: The print pattern was not formed in some parts.
C: The reverse printing was not able to be performed.

[Resistance Measurement]

A film having a thickness of 600 nm was manufactured on a PEN film using a bar coater, was heated, fired, and reduced by a plasma firing device at 1.5 kw for 420 seconds to manufacture a copper film. A volume resistivity of a conductive film was measured using a low resistivity meter, Loresta-GP manufactured by Mitsubishi Chemical. Table 1 depicts performance results of copper oxide inks and application films.

of (reductant mass/copper oxide mass) were 0.0001 or more to 0.10 or less, and values of (dispersing agent mass/copper oxide mass) were 0.0050 or more to 0.30 or less. It is considered that the use of hydrazine as the reductant promotes the reduction of the copper oxide and the copper film having the low resistance was manufactured.

In contrast to this, in Comparative Example 1 where the value of (reductant mass/copper oxide mass) was smaller than 0.001, it was observed that the copper oxide particles were partially aggregated in the dispersion liquid. Additionally, a copper film was not able to be obtained by plasma firing and therefore the resistance was not able to be measured. In Comparative Example 2 where the value of (reductant mass/copper oxide mass) was larger than 0.1, the copper oxide ink was aggregated and therefore the reverse printing and the measurement of the resistance were not able to be performed. Moreover, both in Comparative Example 3 where the value of (dispersing agent mass/copper oxide mass) was smaller than 0.005 and Comparative Example 4 where the value was larger than 0.30, the copper oxide inks were aggregated and therefore the reverse printing and the measurement of the resistance were not able to be performed.

[Laser Firing]

The copper oxide ink of Working Example 1 was coated with a bar coater on a PET board so as to have a predetermined thickness (800 nm) and was dried for ten minutes at room temperature to obtain a sample A in which an application layer was formed on the PET.

The sample A was irradiated with laser light (wavelength: 445 nm, output: 1.1 W, a continuous wave (CW) oscillation) while a focus position was moved at the maximum speed of 300 mm/minute using a galvanometer scanner to obtain a conductive film containing copper with dimensions of 25 mm×1 mm. The resistance was 20 μΩcm. A conductive film was able to be manufactured by laser firing as well.

Experimental Example 2

(Manufacturing Copper Oxide Particle Dispersing Element)
A dispersing element containing copper oxide particles was manufactured as follows.

Manufacturing Example 1

Copper acetate (II)-hydrate (manufactured by Wako Pure Chemical) of 391.5 g was dissolved in mixed solvent of water of 3670 g and 1,2-propylene glycol (manufactured by

TABLE 1

| | | Working example | | | | | Comparative example | | | |
|---|---|---|---|---|---|---|---|---|---|---|
| | | 1 | 2 | 3 | 4 | 5 | 1 | 2 | 3 | 4 |
| | Reductant mass/ copper oxide mass | 0.015 | 0.0035 | 0.090 | 0.015 | 0.015 | 0.0 | 0.17 | 0.015 | 0.015 |
| | Dispersing agent mass/ copper oxide mass | 0.20 | 0.20 | 0.20 | 0.0050 | 0.30 | 0.20 | 0.20 | 0.0030 | 0.40 |
| Evaluation | Reverse printing | A | A | A | A | A | C | C | C | C |
| | Volume resistance (μΩcm) | 30 | 31 | 30 | 31 | 37 | Measurement impossible | Measurement impossible | Measurement impossible | Measurement impossible |

In Working Example 1 to Working Example 5, the copper oxide inks were not aggregated and low resistances were able to be maintained when the copper films were manufactured on the PEN films. In the working examples, values Wako Pure Chemical) of 1696 g, and hydrazine-hydrate (manufactured by Wako Pure Chemical) of 114 g was added and stirred. Afterwards, the solvent was separated into supernatant and precipitate by centrifugation.

DISPERBYK-118 (manufactured by BYK) of 27.6 g and ethanol (manufactured by Wako Pure Chemical) of 490 g were added to the obtained precipitate of 200 g as the dispersing agent and dispersed under a nitrogen atmosphere using the homogenizer.

Next, concentration with a UF membrane module and dilution with ethanol were repeated, and further dilution with terpineol and concentration with a UF membrane were repeated to obtain a dispersing element S1 of 225.4 g containing cuprous oxide having an average secondary particle diameter of 10 nm of 124 g. The average secondary particle diameter was measured using FPAR-1000 manufactured by OTSUKA ELECTRONICS by cumulant method. The same applies to the following Manufacturing Examples 2 to 15 and Comparative Manufacturing Examples 1 to 3.

Manufacturing Example 2

The copper acetate (II)-hydrate (manufactured by Wako Pure Chemical) of 391.5 g was dissolved in water of 10880 g, and hydrazine-hydrate (manufactured by Wako Pure Chemical) of 114 g was added and stirred. Afterwards, the product was separated into supernatant and precipitate by centrifugation.

Hereinafter, a dispersing element S2 of 225.4 g containing cuprous oxide of 124 g having an average secondary particle diameter of 33 nm was obtained by the combined amounts, the conditions, and the procedures similar to Manufacturing Example 1.

Manufacturing Example 3

Except for the use of DISPERBYK-118 (manufactured by BYK) of 6.9 g as a dispersing agent, a dispersing element S3 of 204.7 g containing cuprous oxide of 124 g having an average secondary particle diameter of 10 nm was obtained by the combined amounts, the conditions, and the procedures same as Manufacturing Example 1.

Manufacturing Example 4

Except for the use of DISPERBYK-118 (manufactured by BYK) of 41.4 g as a dispersing agent, a dispersing element S4 of 239.2 g containing cuprous oxide of 124 g having the average secondary particle diameter of 10 nm was obtained by the combined amounts, the conditions, and the procedures same as Manufacturing Example 1.

Manufacturing Example 5

Except for the use of DISPERBYK-118 (manufactured by BYK) of 6.9 g as a dispersing agent, a dispersing element S5 of 204.7 g containing cuprous oxide of 124 g having an average secondary particle diameter of 33 nm was obtained by the combined amounts, the conditions, and the procedures same as Manufacturing Example 2.

Manufacturing Example 6

Except for the use of DISPERBYK-118 (manufactured by BYK) of 41.4 g as a dispersing agent, a dispersing element S6 of 239.2 g containing cuprous oxide of 124 g having an average secondary particle diameter of 33 nm was obtained by the combined amounts, the conditions, and the procedures same as Manufacturing Example 2.

Manufacturing Example 7

Except for the use of DISPERBYK-118 (manufactured by BYK) of 4.1 g as a dispersing agent, a dispersing element S7 of 201.9 g containing cuprous oxide of 124 g having an average secondary particle diameter of 10 nm was obtained by the combined amounts, the conditions, and the procedures same as Manufacturing Example 1.

Manufacturing Example 8

Except for the use of DISPERBYK-118 (manufactured by BYK) of 55.2 g as a dispersing agent, a dispersing element S8 of 253.0 g containing cuprous oxide of 124 g having an average secondary particle diameter of 10 nm was obtained by the combined amounts, the conditions, and the procedures same as Manufacturing Example 1.

Manufacturing Example 9

Except for the use of DISPERBYK-118 (manufactured by BYK) of 4.1 g as a dispersing agent, a dispersing element S9 of 201.9 g containing cuprous oxide of 124 g having an average secondary particle diameter of 33 nm was obtained by the combined amounts, the conditions, and the procedures same as Manufacturing Example 2.

Manufacturing Example 10

Except for the use of DISPERBYK-118 (manufactured by BYK) of 82.9 g as a dispersing agent, a dispersing element S10 of 280.6 g containing cuprous oxide of 124 g having an average secondary particle diameter of 33 nm was obtained by the combined amounts, the conditions, and the procedures same as Manufacturing Example 2.

Manufacturing Example 11

Terpineol of 101.4 g was added to cuprous oxide of 124 g having a grain diameter of 150 nm and the product was dispersed under a nitrogen atmosphere using the homogenizer to obtain a dispersing element S11 of 225.4 g.

Manufacturing Example 12

Except for the use of γ-butyrolactone instead of the terpineol, a dispersing element S12 of 225.4 g containing cuprous oxide of 124 g was obtained by the combined amounts, the conditions, and the procedures same as Manufacturing Example 1.

Manufacturing Example 13

Except for the use of cyclohexanol instead of the terpineol, a dispersing element S13 of 225.4 g containing cuprous oxide of 124 g was obtained by the combined amounts, the conditions, and the procedures same as Manufacturing Example 1.

Manufacturing Example 14

Except for the use of ethylene glycol monoethyl ether acetate instead of the terpineol, a dispersing element S14 of 225.4 g containing cuprous oxide of 124 g was obtained by the combined amounts, the conditions, and the procedures same as Manufacturing Example 1.

Manufacturing Example 15

Except for the use of tetralin instead of the terpineol, a dispersing element S15 of 225.4 g containing cuprous oxide of 124 g was obtained by the combined amounts, the conditions, and the procedures same as Manufacturing Example 1.

Comparative Manufacturing Example 1

DISPERBYK-118 (manufactured by BYK) of 27.6 and terpineol of 73.8 g were added to cuprous oxide of 124 g having an average secondary particle diameter of 150 nm and the product was dispersed under a nitrogen atmosphere using the homogenizer to obtain a dispersing element H1 of 225.4 g.

Comparative Manufacturing Example 2

Except for the use of toluene instead of the terpineol, a dispersing element H2 of 225.4 g containing cuprous oxide of 124 g was obtained by the combined amounts, the conditions, and the procedures same as Manufacturing Example 1.

Comparative Manufacturing Example 3

Except for the use of butanol instead of the terpineol, a dispersing element H3 of 225.4 g containing cuprous oxide of 124 g was obtained by the combined amounts, the conditions, and the procedures same as Manufacturing Example 1.

Working Examples 6 to 67

Any of the following copper particles A, B, C, D, and E was added to any of the dispersing elements S1 to S15 of 40 g obtained in Manufacturing Examples 1 to 15 by the quantity depicted in Table 2. The product was mixed under a nitrogen atmosphere by a rotary and revolutionary mixer to obtain dispersing elements of Working Examples 6 to 67. Table 2 depicts organic compound mass ratios (BYK/$Cu_2O$) and copper particle mass ratios (Cu/$Cu_2O$) of these dispersing elements.

Copper particles A: needle-shaped copper powder (average particle diameter: 4.7 μm)

Copper particles B: dendritic-shaped copper powder (average particle diameter: 14.5 μm)

Copper particles C: scaly-shaped copper powder (1400YP manufactured by MITSUI MINING & SMELTING CO., LTD., average particle diameter: 4.9 μm)

Copper particles D: spherical-shaped copper powder (average particle diameter: 1 μm)

Copper particles E: spherical-shaped copper powder (average particle diameter: 5 μm)

Line patterns were printed on paper boards with the dispersing elements of Working Examples 6 to 67 by screen-printing method. Then, using a microwave plasma firing device, the dispersing elements were heated and fired at 1.5 kw for 420 seconds to form conductive films having widths of 1 mm, lengths of 100 mm, and film thicknesses of 16 μm on the paper boards.

The dispersing elements of Working Examples 6 to 67 were evaluated for dispersion stability and continuous printability. Additionally, an initial resistance, resistance stability, and a soldering performance were measured on the conductive films obtained using the dispersing elements of Working Examples 6 to 67. Table 2 depicts the results.

The dispersion stability was evaluated as follows.

A . . . A period during which the screen-printing can be performed after the dispersing element is manufactured is 20 days or more B . . . A period during which the screen-printing can be performed after the dispersing element is manufactured is five days or more to less than 20 days C . . . A period during which the screen-printing can be performed after the dispersing element is manufactured is less than five days The screen-printing on the paper board was continuously performed multiple times, and in the continuous printability, the number of printings that the screen-printing can be continuously performed was five times or more was evaluated as A and the number of printings that the screen-printing can be continuously performed was less than five times was evaluated as B. Table 2 depicts the results.

The initial resistance is volume resistivity (unit: $10^{-5}$ Ω·cm) of the conductive film immediately after firing. The volume resistivity was measured using Loresta-GP, the low resistivity meter manufactured by Mitsubishi Chemical.

The resistance stability is expressed by a ratio of the volume resistivity of the conductive film 100 days after the firing to the volume resistivity of the conductive film immediately after the firing.

In a soldering test, a wire solder containing flux (tin: 60%, lead: 40%) was soldered to the paper board on which the conductive film was formed using a soldering iron and the soldered part was visually observed. The soldering performance was evaluated as follows. In a case where the surface of the conductive film was completely wet with the solder and cissing was not confirmed at all, it was evaluated as "A: no dewetting" and in a case where cissing was able to be confirmed even a little, it was evaluated as "B: with dewetting."

Working Examples 68 to 70

Line patterns were printed on paper boards with dispersing elements of 6, 8, and 44 by screen-printing method. Then, using a light firing device manufactured by NovaCentrix, PulseForge 1300, light firing was performed at an energy density of 7 J/$cm^2$ and a pulse width of 8 msecs to form conductive films having widths of 1 mm, lengths of 100 mm, and film thicknesses of 16 μm on the paper boards.

The initial resistance and the resistance stability were measured on the conductive films thus obtained using the dispersing elements of Working Examples 68 to 70 and the soldering test was conducted. Table 2 depicts the results.

A surface roughness measured on the surface of the conductive film obtained using the dispersing element of Working Example 6 was 1340 nm. The surface roughness of the surface of the conductive film was measured by the following method.

Measurement method: compliant with JIS B0601 2013 (ISO25178-2: 2012)

Measuring machine: laser microscope VK-X250 manufactured by KEYENCE CORPORATION, lens magnification: 150 powers The surface shape of the conductive film was measured at a center of an electrode using the laser microscope. Arithmetic mean height was obtained targeting an entire screen of an unevenness image obtained by the laser microscope and was determined as the surface roughness.

Comparative Example 5

Ethanol of 98 g was added to the precipitate of 40 g obtained by the combined amounts, the conditions, and the procedures same as Manufacturing Example 1, and the precipitate was dispersed under a nitrogen atmosphere using the homogenizer but was not dispersed.

Comparative Example 6

Ethanol of 98 g was added to the precipitate of 40 g obtained by the combined amounts, the conditions, and the procedures same as Manufacturing Example 2, and the precipitate was dispersed under a nitrogen atmosphere using the homogenizer but was not dispersed.

Comparative Example 7

Terpineol of 98 g was added to a mixture of the precipitate obtained by the combined amounts, the conditions, and the procedures same as Manufacturing Example 1 and ethanol, and the precipitate was dispersed under a nitrogen atmosphere using the homogenizer but was not dispersed.

Comparative Example 8

Terpineol of 98 g was added to a mixture of the precipitate obtained by the combined amounts, the conditions, and the procedures same as Manufacturing Example 2 and ethanol, and the precipitate was dispersed under a nitrogen atmosphere using the homogenizer but was not dispersed.

Comparative Examples 9 to 11

Copper particles F: spherical-shaped copper powders (average particle diameter: 200 μm) of 88 g were added to the dispersing elements H1, S1, and S2 of 40 g obtained by Comparative Manufacturing Example 1 and Manufacturing Examples 1 and 2, and the product was mixed under a nitrogen atmosphere by the rotary and revolutionary mixer to obtain dispersing elements of Comparative Examples 9 to 11. Table 2 depicts organic compound mass ratios (BYK/$Cu_2O$) and copper particle mass ratios (Cu/$Cu_2O$) of these dispersing elements.

Using the dispersing elements of Comparative Examples 9 to 11, conductive films were formed on paper boards with the conditions identical to those of Working Examples 6 to 67. The dispersing elements of Comparative Examples 9 to 11 were evaluated for dispersion stability and continuous printability. Additionally, an initial resistance, resistance stability, and soldering performance were measured on the conductive films obtained using the dispersing elements of Comparative Examples 9 to 11. Table 2 depicts the results.

Comparative Example 12

Diethylene glycol of 400 g was added to the precipitate of 200 g obtained by the combined amounts, the conditions, and the procedures same as Manufacturing Example 1, and the precipitate was dispersed under a nitrogen atmosphere using the homogenizer to obtain a dispersing element containing cuprous oxide.

Copper particles D: spherical-shaped copper powder (average particle diameter: 1 μm) of 88 g was added to this dispersing element of 40 g, and the dispersing element was mixed under a nitrogen atmosphere by the rotary and revolutionary mixer to obtain a dispersing element of Comparative Example 12.

Although a line pattern of the dispersing element of Comparative Example 12 was attempted to be printed on a paper board by screen-printing method, the aggregation of the copper particles proceeded rapidly and the printing was not able to be performed.

Comparative Example 13

Terpineol of 18 g was added to the copper particles B of 88 g, and the product was mixed under a nitrogen atmosphere by the rotary and revolutionary mixer to obtain a dispersing element of Comparative Example 13. Since this dispersing element does not contain cuprous oxide particles, the copper particle mass ratio (Cu/$Cu_2O$) is zero as depicted in Table 2.

Using the dispersing element of Comparative Example 13, a conductive film was formed on a paper board with the conditions identical to those of Working Examples 6 to 67. The initial resistance and the resistance stability were measured on the conductive film thus obtained using the dispersing element of Comparative Example 13. Table 2 depicts the results.

Comparative Example 14

Copper particles were not added to the dispersing element S11 of 40 g obtained in Manufacturing Example 11, and the dispersing element S11 was mixed under a nitrogen atmosphere by the rotary and revolutionary mixer to obtain a dispersing element of Comparative Example 14. The copper particle mass ratios (Cu/$Cu_2O$) of these dispersing elements are zero as depicted in Table 2.

Using the dispersing element of Comparative Example 14, a conductive film was formed on a paper board with the conditions identical to those of Working Examples 6 to 67. The initial resistance and resistor stability were measured on the conductive film thus obtained using the dispersing element of Comparative Example 14. Table 2 depicts the results.

TABLE 2

|  |  | Working example | | | | | | | |
|---|---|---|---|---|---|---|---|---|---|
|  |  | 6 | 7 | 8 | 9 | 10 | 11 | 12 | 13 |
| Dispersing element | S1 | 40 g |  | 40 g |  |  |  | 40 g | 40 g |
|  | S2 |  | 40 g |  | 40 g |  |  |  |  |
|  | S3 |  |  |  |  | 40 g |  |  |  |
|  | S4 |  |  |  |  |  | 40 g |  |  |
|  | S5 |  |  |  |  |  |  |  |  |
|  | S6 |  |  |  |  |  |  |  |  |
|  | S7 |  |  |  |  |  |  |  |  |
|  | S8 |  |  |  |  |  |  |  |  |
|  | S9 |  |  |  |  |  |  |  |  |
|  | S10 |  |  |  |  |  |  |  |  |
|  | S11 |  |  |  |  |  |  |  |  |

TABLE 2-continued

|  |  | Working example | | | | | | | |
|---|---|---|---|---|---|---|---|---|---|
|  |  | 6 | 7 | 8 | 9 | 10 | 11 | 12 | 13 |
| Dispersing element | S1 | | | | | | | | |
|  | S2 | | | | | | | | |
|  | S3 | | | | | | | | |
|  | S4 | | | | | | | | |
|  | S5 | | | | | | | | |
|  | S6 | | | | | | | | |
|  | S7 | | | | | | | | |
|  | S8 | | | | | | | | |
|  | S9 | | | | | | | | |
|  | S10 | | | | | | | | |
|  | S11 | | | | | | | | |
|  | S12 | | | | | | | | |
|  | S13 | | | | | | | | |
|  | S14 | | | | | | | | |
|  | S15 | | | | | | | | |
|  | H1 | | | | | | | | |
|  | H2 | | | | | | | | |
|  | H3 | | | | | | | | |
| Copper particles | A (Needle shape) | 88 g | 88 g | | | 88 g | 88 g | 22 g | 154 g |
|  | B (Dendritic shape) | | | 44 g | 44 g | | | | |
|  | C (Scaly shape) | | | | | | | | |
|  | D (Spherical shape, 1 μm) | | | | | | | | |
|  | E (Spherical shape, 5 μm) | | | | | | | | |
|  | F (Spherical shape, 200 μm) | | | | | | | | |
|  | BYK/Cu$_2$O | 0.20 | 0.20 | 0.20 | 0.20 | 0.050 | 0.30 | 0.20 | 0.20 |
|  | Cu/Cu$_2$O | 4.0 | 4.0 | 2.0 | 2.0 | 4.0 | 4.0 | 1.0 | 7.0 |
| Evaluation | Dispersion stability | A | A | A | A | A | A | A | A |
|  | Continuous printability | A | A | A | A | A | A | A | A |
|  | Initial resistance | 2.7 | 2.97 | 5.8 | 6.4 | 1.4 | 5.4 | 4.1 | 5.4 |
|  | Resistance stability | 1.2 | 1.4 | 1.0 | 1.3 | 1.3 | 1.2 | 1.3 | 1.4 |
|  | Soldering performance | A | A | A | A | A | A | A | A |

|  |  | Working example | | | | | | |
|---|---|---|---|---|---|---|---|---|
|  |  | 14 | 15 | 16 | 17 | 18 | 19 | 20 |
| Dispersing element | S1 | | | | | | | 40 g |
|  | S2 | | | 40 g | 40 g | | | |
|  | S3 | | | | | 40 g | | |
|  | S4 | | | | | | 40 g | |
|  | S5 | 40 g | | | | | | |
|  | S6 | | 40 g | | | | | |
|  | S7 | | | | | | | |
|  | S8 | | | | | | | |
|  | S9 | | | | | | | |
|  | S10 | | | | | | | |
|  | S11 | | | | | | | |
|  | S12 | | | | | | | |
|  | S13 | | | | | | | |
|  | S14 | | | | | | | |
|  | S15 | | | | | | | |
|  | H1 | | | | | | | |
|  | H2 | | | | | | | |
|  | H3 | | | | | | | |
| Copper particles | A (Needle shape) | 88 g | 88 g | 22 g | 154 g | | | |
|  | B (Dendritic shape) | | | | | 44 g | 44 g | 22 g |
|  | C (Scaly shape) | | | | | | | |
|  | D (Spherical shape, 1 μm) | | | | | | | |
|  | E (Spherical shape, 5 μm) | | | | | | | |
|  | F (Spherical shape, 200 μm) | | | | | | | |
|  | BYK/Cu$_2$O | 0.050 | 0.30 | 0.20 | 0.20 | 0.050 | 0.30 | 0.20 |
|  | Cu/Cu$_2$O | 4.0 | 4.0 | 1.0 | 7.0 | 4.0 | 4.0 | 4.0 |
| Evaluation | Dispersion stability | A | A | A | A | A | A | A |
|  | Continuous printability | A | A | A | A | A | A | A |
|  | Initial resistance | 1.5 | 5.9 | 4.5 | 5.9 | 2.9 | 12 | 8.7 |
|  | Resistance stability | 1.2 | 1.4 | 1.0 | 1.4 | 1.0 | 1.0 | 1.1 |
|  | Soldering performance | A | A | A | A | A | A | A |

|  |  | Working example | | | | | | | | | | |
|---|---|---|---|---|---|---|---|---|---|---|---|---|
|  |  | 21 | 22 | 23 | 24 | 25 | 26 | 27 | 28 | 29 | 30 | 31 |
| Dispersing element | S1 | 40 g | | | | | | | 40 g | 40 g | | |
|  | S2 | | | | 40 g | 40 g | | | | | | |
|  | S3 | | | | | | | | | | | |
|  | S4 | | | | | | | | | | | |
|  | S5 | | 40 g | | | | | | | | | |
|  | S6 | | | 40 g | | | | | | | | |
|  | S7 | | | | | | 40 g | | | | | |
|  | S8 | | | | | | | 40 g | | | | |
|  | S9 | | | | | | | | | | 40 g | |
|  | S10 | | | | | | | | | | | 40 g |
|  | S11 | | | | | | | | | | | |
|  | S12 | | | | | | | | | | | |
|  | S13 | | | | | | | | | | | |

TABLE 2-continued

|  |  |  |  |  |  |  |  |  |  |  |  |
|---|---|---|---|---|---|---|---|---|---|---|---|
|  | S14 |  |  |  |  |  |  |  |  |  |  |
|  | S15 |  |  |  |  |  |  |  |  |  |  |
|  | H1 |  |  |  |  |  |  |  |  |  |  |
|  | H2 |  |  |  |  |  |  |  |  |  |  |
|  | H3 |  |  |  |  |  |  |  |  |  |  |
| Copper particles | A (Needle shape) |  |  |  |  |  | 88 g | 88 g | 11 g | 220 g | 88 g | 88 g |
|  | B (Denritic shape) | 154 g | 44 g | 44 g | 22 g | 154 g |  |  |  |  |  |  |
|  | C (Scaly shape) |  |  |  |  |  |  |  |  |  |  |  |
|  | D (Spherical shape, 1 μm) |  |  |  |  |  |  |  |  |  |  |  |
|  | E (Spherical shape, 5 μm) |  |  |  |  |  |  |  |  |  |  |  |
|  | F (Spherical shape, 200 μm) |  |  |  |  |  |  |  |  |  |  |  |
|  | BYK/Cu$_2$O | 0.20 | 0.050 | 0.30 | 0.20 | 0.20 | 0.030 | 0.40 | 0.10 | 0.10 | 0.030 | 0.40 |
|  | Cu/Cu$_2$O | 7.0 | 4.0 | 4.0 | 1.0 | 7.0 | 4.0 | 4.0 | 0.50 | 10 | 4.0 | 4.0 |
| Evaluation | Dispersion stability | A | A | A | A | A | B | B | B | B | B | B |
|  | Continuous printability | A | A | A | A | A | A | A | A | A | A | A |
|  | Initial resistance | 11.6 | 3.19 | 12.76 | 9.57 | 12.76 | 4.1 | 8.1 | 5.4 | 8.1 | 4.5 | 8.9 |
|  | Resistance stability | 1.2 | 1 | 1.4 | 1.4 | 1.3 | 1.3 | 1.2 | 1.3 | 1.4 | 1.3 | 1.2 |
|  | Soldering performance | A | A | A | A | A | A | A | A | A | A | A |

|  |  | Working example | | | | | | | |
|---|---|---|---|---|---|---|---|---|---|
|  |  | 32 | 33 | 34 | 35 | 36 | 37 | 38 | 39 | 40 |
| Dispersing element | S1 |  |  |  |  | 40 g | 40 g |  |  |  |
|  | S2 | 40 g | 40 g |  |  |  |  |  |  | 40 g |
|  | S3 |  |  |  |  |  |  |  |  |  |
|  | S4 |  |  |  |  |  |  |  |  |  |
|  | S5 |  |  |  |  |  |  |  |  |  |
|  | S6 |  |  |  |  |  |  |  |  |  |
|  | S7 |  |  | 40 g |  |  |  |  |  |  |
|  | S8 |  |  |  | 40 g |  |  |  |  |  |
|  | S9 |  |  |  |  |  |  | 40 g |  |  |
|  | S10 |  |  |  |  |  |  |  | 40 g |  |
|  | S11 |  |  |  |  |  |  |  |  |  |
|  | S12 |  |  |  |  |  |  |  |  |  |
|  | S13 |  |  |  |  |  |  |  |  |  |
|  | S14 |  |  |  |  |  |  |  |  |  |
|  | S15 |  |  |  |  |  |  |  |  |  |
|  | H1 |  |  |  |  |  |  |  |  |  |
|  | H2 |  |  |  |  |  |  |  |  |  |
|  | H3 |  |  |  |  |  |  |  |  |  |
| Copper particles | A (Needle shape) | 11 g | 220 g |  |  |  |  |  |  |  |
|  | B (Denritic shape) |  |  | 44 g | 44 g | 11 g | 220 g | 44 g | 44 g | 11 g |
|  | C (Scaly shape) |  |  |  |  |  |  |  |  |  |
|  | D (Spherical shape, 1 μm) |  |  |  |  |  |  |  |  |  |
|  | E (Spherical shape, 5 μm) |  |  |  |  |  |  |  |  |  |
|  | F (Spherical shape, 200 μm) |  |  |  |  |  |  |  |  |  |
|  | BYK/Cu$_2$O | 0.20 | 0.20 | 0.030 | 0.40 | 0.20 | 0.20 | 0.030 | 0.40 | 0.20 |
|  | Cu/Cu$_2$O | 0.50 | 10 | 4.0 | 4.0 | 0.50 | 10 | 4.0 | 4.0 | 0.50 |
| Evaluation | Dispersion stability | B | B | B | B | B | B | B | B | B |
|  | Continuous printability | A | A | A | A | A | A | A | A | A |
|  | Initial resistance | 5.9 | 8.9 | 8.7 | 17 | 12 | 17 | 9.6 | 19 | 13 |
|  | Resistance stability | 1.4 | 1.3 | 1.0 | 1.0 | 1.1 | 1.2 | 1.1 | 1.1 | 1.0 |
|  | Soldering performance | A | A | A | A | A | A | A | A | A |

|  |  | Working example | | | | | | | | | | |
|---|---|---|---|---|---|---|---|---|---|---|---|---|
|  |  | 41 | 42 | 43 | 44 | 45 | 46 | 47 | 48 | 49 | 50 | 51 |
| Dispersing element | S1 |  | 40 g | 40 g | 40 g |  |  | 40 g | 40 g |  |  | 40 g |
|  | S2 | 40 g |  |  |  |  |  |  |  |  |  |  |
|  | S3 |  |  |  |  | 40 g |  |  |  |  |  |  |
|  | S4 |  |  |  |  |  | 40 g |  |  |  |  |  |
|  | S5 |  |  |  |  |  |  |  |  |  |  |  |
|  | S6 |  |  |  |  |  |  |  |  |  |  |  |
|  | S7 |  |  |  |  |  |  |  |  | 40 g |  |  |
|  | S8 |  |  |  |  |  |  |  |  |  | 40 g |  |
|  | S9 |  |  |  |  |  |  |  |  |  |  |  |
|  | S10 |  |  |  |  |  |  |  |  |  |  |  |
|  | S11 |  |  |  |  |  |  |  |  |  |  |  |
|  | S12 |  |  |  |  |  |  |  |  |  |  |  |
|  | S13 |  |  |  |  |  |  |  |  |  |  |  |
|  | S14 |  |  |  |  |  |  |  |  |  |  |  |
|  | S15 |  |  |  |  |  |  |  |  |  |  |  |

TABLE 2-continued

|  |  |  |  |  |  |  |  |  |  |  |  |
|---|---|---|---|---|---|---|---|---|---|---|---|
|  | H1 |  |  |  |  |  |  |  |  |  |  |
|  | H2 |  |  |  |  |  |  |  |  |  |  |
|  | H3 |  |  |  |  |  |  |  |  |  |  |
| Copper particles | A (Needle shape) |  |  |  |  |  |  |  |  |  |  |
|  | B (Dendritic shape) | 220 g |  |  |  |  |  |  |  |  |  |
|  | C (Scaly shape) |  |  | 88 g | 88 g | 88 g | 22 g | 154 g | 88 g | 88 g | 11 g |
|  | D (Spherical shape, 1 μm) |  | 88 g |  |  |  |  |  |  |  |  |
|  | E (Spherical shape, 5 μm) |  |  | 88 g |  |  |  |  |  |  |  |
|  | F (Spherical shape, 200 μm) |  |  |  |  |  |  |  |  |  |  |
|  | BYK/$Cu_2O$ | 0.20 | 0.20 | 0.20 | 0.20 | 0.050 | 0.30 | 0.20 | 0.20 | 0.030 | 0.40 | 0.20 |
|  | Cu/$Cu_2O$ | 10 | 4.0 | 4.0 | 4.0 | 4.0 | 4.0 | 1.0 | 7.0 | 4.0 | 4.0 | 0.50 |
| Evaluation | Dispersion stability | B | A | A | A | A | A | A | A | B | B | B |
|  | Continuous printability | A | A | A | A | A | A | A | A | A | A | A |
|  | Initial resistance | 19 | 7.0 | 9.2 | 2.5 | 1.3 | 5.0 | 3.8 | 5.0 | 3.8 | 7.5 | 5.0 |
|  | Resistance stabilty | 1.3 | 2.8 | 2.8 | 1.0 | 1.0 | 1.0 | 1.1 | 1.2 | 1.0 | 1.0 | 1.1 |
|  | Soldering performance | A | A | A | A | A | A | A | A | A | A | A |

|  |  | Working example |  |  |  |  |  |  |  |  |
|---|---|---|---|---|---|---|---|---|---|---|
|  |  | 52 | 53 | 54 | 55 | 56 | 57 | 58 | 59 | 60 |
| Dispersing element | S1 | 40 g |  |  |  |  |  |  |  |  |
|  | S2 |  |  |  |  |  |  |  |  |  |
|  | S3 |  |  |  |  |  |  |  |  |  |
|  | S4 |  |  |  |  |  |  |  |  |  |
|  | S5 |  |  |  |  |  |  |  |  |  |
|  | S6 |  |  |  |  |  |  |  |  |  |
|  | S7 |  |  |  |  |  |  |  |  |  |
|  | S8 |  |  |  |  |  |  |  |  |  |
|  | S9 |  |  |  |  |  |  |  |  |  |
|  | S10 |  |  |  |  |  |  |  |  |  |
|  | S11 |  | 40 g | 40 g | 40 g |  |  |  |  |  |
|  | S12 |  |  |  |  | 40 g | 40 g | 40 g |  |  |
|  | S13 |  |  |  |  |  |  |  | 40 g | 40 g |
|  | S14 |  |  |  |  |  |  |  |  |  |
|  | S15 |  |  |  |  |  |  |  |  |  |
|  | H1 |  |  |  |  |  |  |  |  |  |
|  | H2 |  |  |  |  |  |  |  |  |  |
|  | H3 |  |  |  |  |  |  |  |  |  |
| Copper particles | A (Needle shape) |  | 88 g |  |  | 88 g |  |  | 88 g |  |
|  | B (Dendritic shape) |  |  | 44 g |  |  | 44 g |  |  | 44 g |
|  | C (Scaly shape) | 220 g |  |  | 88 g |  |  | 88 g |  |  |
|  | D (Spherical shape, 1 μm) |  |  |  |  |  |  |  |  |  |
|  | E (Spherical shape, 5 μm) |  |  |  |  |  |  |  |  |  |
|  | F (Spherical shape, 200 μm) |  |  |  |  |  |  |  |  |  |
|  | BYK/$Cu_2O$ | 0.20 | 0.0 | 0.0 | 0.0 | 0.20 | 0.20 | 0.20 | 0.20 | 0.20 |
|  | Cu/$Cu_2O$ | 10 | 4.0 | 2.0 | 4.0 | 4.0 | 2.0 | 4.0 | 4.0 | 2.0 |
| Evaluation | Dispersion stability | B | B | B | B | A | A | A | A | A |
|  | Continuous printability | A | A | A | A | A | A | A | A | A |
|  | Initial resistance | 7.5 | 3.2 | 6.5 | 4.3 | 3.0 | 6.1 | 2.9 | 3.5 | 7.1 |
|  | Resistance stabilty | 1.2 | 1.3 | 1.3 | 1.2 | 1.1 | 1.3 | 1.3 | 1.1 | 1.2 |
|  | Soldering performance | A | A | A | A | A | A | A | A | A |

|  |  | Working example |  |  |  |  |  |  |  |  |  |
|---|---|---|---|---|---|---|---|---|---|---|---|
|  |  | 61 | 62 | 63 | 64 | 65 | 66 | 67 | 68 | 69 | 70 |
| Dispersing element | S1 |  |  |  |  |  |  |  | 40 g | 40 g | 40 g |
|  | S2 |  |  |  |  |  |  |  |  |  |  |
|  | S3 |  |  |  |  |  |  |  |  |  |  |
|  | S4 |  |  |  |  |  |  |  |  |  |  |
|  | S5 |  |  |  |  |  |  |  |  |  |  |
|  | S6 |  |  |  |  |  |  |  |  |  |  |
|  | S7 |  |  |  |  |  |  |  |  |  |  |
|  | S8 |  |  |  |  |  |  |  |  |  |  |
|  | S9 |  |  |  |  |  |  |  |  |  |  |
|  | S10 |  |  |  |  |  |  |  |  |  |  |
|  | S11 |  |  |  |  |  |  |  |  |  |  |
|  | S12 |  |  |  |  |  |  |  |  |  |  |
|  | S13 | 40 g |  |  |  |  |  |  |  |  |  |
|  | S14 |  | 40 g | 40 g | 40 g |  |  |  |  |  |  |
|  | S15 |  |  |  |  | 40 g | 40 g | 40 g |  |  |  |
|  | H1 |  |  |  |  |  |  |  |  |  |  |

TABLE 2-continued

| | | | | | | | | | | | |
|---|---|---|---|---|---|---|---|---|---|---|---|
| | H2 | | | | | | | | | | |
| | H3 | | | | | | | | | | |
| Copper particles | A (Needle shape) | | 88 g | | | 88 g | | | 88 g | | | |
| | B (Dendritic shape) | | | 44 g | | | 44 g | | | 44 g | | |
| | C (Scaly shape) | 88 g | | | 88 g | | | 88 g | | | 88 g | |
| | D (Spherical shape, 1 μm) | | | | | | | | | | | |
| | E (Spherical shape, 5 μm) | | | | | | | | | | | |
| | F (Spherical shape, 200 μm) | | | | | | | | | | | |
| | BYK/Cu$_2$O | 0.20 | 0.20 | 0.20 | 0.20 | 0.20 | 0.20 | 0.20 | 0.20 | 0.20 | 0.20 |
| | Cu/Cu$_2$O | 4.0 | 4.0 | 2.0 | 4.0 | 4.0 | 2.0 | 4.0 | 4.0 | 2.0 | 4.0 |
| Evaluation | Dispersion stability | A | A | A | A | A | A | A | A | A | A |
| | Continuous printability | A | A | A | A | A | A | A | A | A | A |
| | Initial resistance | 2.7 | 2.7 | 7.1 | 2.6 | 3.3 | 7.2 | 3.0 | 1.9 | 1.8 | 1.6 |
| | Resistance stability | 1.2 | 1.1 | 1.2 | 1.2 | 1.1 | 1.1 | 1.2 | 1.1 | 1 | 1.0 |
| | Soldering performance | A | A | A | A | A | A | A | A | A | A |

| | | Comparative example | | | | | | |
|---|---|---|---|---|---|---|---|---|
| | | 9 | 10 | 11 | 13 | 14 | 15 | 16 |
| Dispersing element | S1 | | 40 g | | | | | |
| | S2 | | | 40 g | | | | |
| | S3 | | | | | | | |
| | S4 | | | | | | | |
| | S5 | | | | | | | |
| | S6 | | | | | | | |
| | S7 | | | | | | | |
| | S8 | | | | | | | |
| | S9 | | | | | | | |
| | S10 | | | | | | | |
| | S11 | | | | | 40 g | | |
| | S12 | | | | | | | |
| | S13 | | | | | | | |
| | S14 | | | | | | | |
| | S15 | | | | | | | |
| | H1 | 40 g | | | | | | |
| | H2 | | | | | | 40 g | |
| | H3 | | | | | | | 40 g |
| Copper particles | A (Needle shape) | | | | | | 88 g | 88 g |
| | B (Dendritic shape) | | | | 88 g | | | |
| | C (Scaly shape) | | | | | | | |
| | D (Spherical shape, 1 μm) | | | | | | | |
| | E (Spherical shape, 5 μm) | | | | | | | |
| | F (Spherical shape, 200 μm) | 88 g | 88 g | 88 g | | | | |
| | BYK/Cu$_2$O | 0.20 | 0.20 | 0.20 | 0.0 | 0.0 | 0.20 | 0.20 |
| | Cu/Cu$_2$O | 4.0 | 4.0 | 4.0 | 0.0 | 0.0 | 4.0 | 4.0 |
| Evaluation | Dispersion stability | C | B | B | A | A | A | A |
| | Continuous printability | A | A | A | A | A | B | B |
| | Initial resistance | 9.5 | 8.0 | 10 | 26 | 23 | 3.3 | 3.5 |
| | Resistance stability | 3.0 | 3.2 | 3.2 | 1.9 | 2.4 | 1.2 | 1.3 |
| | Soldering performance | A | A | A | A | A | A | A |

As apparent from Table 2, when the copper particles A: needle-shaped copper powder (average particle diameter: 4.7 μm), the copper particles B: the dendritic-shaped copper powder (average particle diameter: 14.5 μm), the copper particles C: the scaly-shaped copper powder (average particle diameter: 4.9 μm), the copper particles D: spherical-shaped copper powder (average particle diameter: 1 μm), and the copper particles E: spherical-shaped copper powder (average particle diameter: 5 μm) were added to the dispersing elements S1 to S15 containing the cuprous oxide particles having the average secondary particle diameters of 10 nm or 33 nm, and DISPERBYK-118, which is an example of the organic compound having the phosphate group, was used, it has been confirmed that the obtained dispersing elements of Working Examples 6 to 67 were excellent in dispersion stability and also excellent in continuous printability. Additionally, it has been confirmed that the conductive films of Working Examples 6 to 67, which were obtained by using the dispersing elements of Working Examples 6 to 67, printing the line patterns by screen-printing method, and performing the firing process, had the low initial resistances and were excellent in resistance stability and further were excellent in soldering performance.

From these results, it has been confirmed that the dispersing element containing the copper oxide particles having the average secondary particle diameters of 1 nm or more to 50 nm or less, the copper particles having the particle diameters of 0.1 μm or more to 100 μm or less, and the organic compound having the phosphate group is excellent in dispersion stability and the screen-printing is possible even after a long period passes after manufacturing the dispersing element. Additionally, it has been found that the conductive film obtained using the dispersing element has the low initial resistance and is excellent in resistance stability. Further, the conductive film is found to be excellent in soldering performance. The mass ratio of the organic compound having the phosphate group to the mass of the copper oxide is found to be preferred from 0.0050 or more to 0.40 or less and more preferred from 0.0050 or more to 0.30 or less.

From these results, it has confirmed that in Working Examples 6 to 67 in which the copper particles A: needle-shaped copper powder, the copper particles B: the dendritic-shaped copper powder, and the copper particles C: scaly-shaped copper powder were added to the dispersing elements S1 to S15 containing the cuprous oxide particles, the conductive films obtained by using the dispersing elements, printing the line patterns by screen-printing method, and performing the firing process had the low initial resistances and were excellent in resistance stability. Additionally, the soldering performance was also excellent. The same applies to Working Examples 68 to 70.

As described above, it has been found that the conductive films using the dispersing elements of the working examples are excellent in soldering performance. Accordingly, it has been confirmed that a failure of the solder bonding portion bonded to the conductive film and the bonded portion of the electronic component can be prevented and the boards with the electronic components can be manufactured at a high yield.

Furthermore, as seen from the evaluation on the initial resistance and the resistance stability of the conductive films, it has been confirmed that the board with the electronic component having the excellent performance can be obtained.

It has been confirmed that, although Working Examples 53 to 55 using the dispersing element S11 do not use the dispersing agent (DISPERBYK-118), the screen-printing is possible, and further the initial resistance is low and the resistance stability is excellent. The excellent soldering performance has been confirmed. Thus, it has been confirmed that the use of the dispersing agent does not affect the effects of the dispersing element of the embodiments.

Meanwhile, with the dispersing elements of Comparative Example 5 to Comparative Example 8 that do not use DISPERBYK-118, which is one example of the organic compound having the phosphate group, the screen-printing was not able to be performed.

Moreover, the dispersing element of Comparative Example 9 containing the cuprous oxide particles having the average secondary particle diameter of 150 nm and the copper particles F: spherical-shaped copper powder having the particle diameter of 200 μm was evaluated as C for dispersion stability. It has been confirmed that the conductive film obtained using the dispersing element had the low initial resistance and was excellent in soldering performance but was poor in resistance stability.

The dispersing elements of Comparative Examples 10 and 11 produced by adding the copper particles F: spherical-shaped copper powder having the particle diameter of 200 μm to the dispersion liquids S1 and S2 were evaluated as B for dispersion stability. However, it has been confirmed that the conductive films obtained using these dispersing elements had the low initial resistance and were excellent in soldering performance but were poor in resistance stability.

The screen-printing was not able to be performed in Comparative Example 12. It has been confirmed that like Comparative Examples 13 and 14, in the case where any one of the cuprous oxide particles or the copper particles is contained, although the screen-printing is possible, the initial resistance is high and the resistance stability is low.

Comparative Examples 15 and 16

The copper particles A of 88 g were added to the dispersing elements H2 and H3 of 40 g obtained in Comparative Manufacturing Examples 2 and 3, and the products were mixed with the rotary and revolutionary mixer under a nitrogen atmosphere to obtain the dispersing elements of Comparative Examples 15 and 16. Table 2 depicts the copper particle mass ratios (Cu/Cu$_2$O) of these dispersing elements.

Conductive films were formed on paper boards with the conditions identical to Working Examples 6 to 67 using the dispersing elements of Comparative Examples 15 and 16. The initial resistances were measured on the conductive films thus obtained using the dispersing elements of Comparative Examples 15 and 16. The continuous printability was evaluated on the dispersing elements of Comparative Examples 15 and 16. Table 2 depicts these results.

As apparent from Table 2, it has been confirmed that the conductive films obtained by printing the line patterns by screen-printing method using the dispersing elements of Working Example 53 to 67 produced by adding the copper particles A: needle-shaped copper powder, the copper particles B: the dendritic-shaped copper powder, and the copper particles C: scaly-shaped copper powder to the dispersing elements S11 to S15 containing the cuprous oxide particles using terpineol, γ-butyrolactone, cyclohexanol, ethylene glycol monoethyl ether acetate, and tetralin as the dispersion mediums and performing the firing process had the low initial resistances. The dispersing elements were evaluated as A for continuous printability.

As depicted in Table 2, Comparative Examples 15 and 16 using toluene and butanol as the dispersion mediums had the low initial resistances but evaluated as B for continuous printability. From these results, it has been confirmed that terpineol, γ-butyrolactone, cyclohexanol, ethylene glycol monoethyl ether acetate, and tetralin contribute to the improvement in continuous printability.

Accordingly, like Working Examples 53 to 67 disclosed in Table 2, it has been found that the use of the dispersing element containing the cuprous oxide particles, the needle-shaped, the dendritic-shaped, or the scaly-shaped copper particles, containing any of terpineol, γ-butyrolactone, cyclohexanol, ethylene glycol monoethyl ether acetate, and tetralin as the dispersion medium, and containing the organic compound having the phosphate group allows obtaining the conductive film having the low initial resistance and the excellent continuous printability by screen-printing method.

Comparative Example 17

A line pattern was printed on a paper board using a copper paste CP-1P for screen-printing manufactured by NOF CORPORATION, which did not contain cuprous oxide particles and did not contain an organic compound having a phosphate group by screen-printing method, and then plasma firing was performed with the conditions similar to Working Examples 6 to 67 to form a conductive film on the paper board.

While a soldering test was conducted on the obtained conductive film of Comparative Example 17, dewetting was present and the evaluation was B. The surface roughness of the conductive film was measured, and the surface roughness was 858 nm.

As apparent from Table 2, it has been confirmed that in the case where the copper particles A: needle-shaped copper powder, the copper particles B: dendritic-shaped copper powder, and the copper particles C: scaly-shaped copper powder were added to the dispersing elements S1, 3, 4, 7, and 8 containing the cuprous oxide particles, the conductive films obtained by printing the line patterns by screen-printing method using the dispersing elements and performing the firing process exhibited the low initial resistance, the high resistance stability, and the excellent soldering performance.

Although the screen-printing was able to be performed in Comparative Example 17, the soldering performance was evaluated as B and the soldering performance was inferior. This result suggests that, although the use of the copper paste allowed the screen-printing, the organic component generating the dewetting remained in the conductive film after the plasma firing; therefore, the soldering performance was poor.

claim 1 is based on Experimental Example 1. Claims 2 and 3 are based on Experimental Example 2.

Note that the present invention is not limited to the above-described embodiments and respective working examples. Based on knowledge of a person skilled in the art, for example, a design of the embodiments and the respective working examples may be changed. Additionally, the embodiments and the respective working examples may be in any given combination, and the aspect adding such a change and the like is within the scope of the present invention.

This application is based on Japanese Patent Application No. 2017-51568, Japanese Patent Application No. 2017-51569, Japanese Patent Application No. 2017-51570, Japanese Patent Application No. 2017-51571, and Japanese Patent Application No. 2017-51572 filed on Mar. 16, 2017, and Japanese Patent Application No. 2017-145188 filed on Jul. 27, 2017, and Japanese Patent Application No. 2018-23239 and Japanese Patent Application No. 2018-23242 filed on Feb. 13, 2018. The entire contents of which are incorporated herein by reference.

The invention claimed is:

1. A dispersing element comprising:
a copper oxide, a dispersing agent, and a reductant, wherein
the dispersing agent is a phosphorus-containing organic matter,
content of the reductant is in a range of a following formula (1), and
content of the dispersing agent is in a range of a following formula (2):

$$0.0001 \leq (\text{reductant mass/copper oxide mass}) \leq 0.10 \quad (1)$$

$$0.0050 \leq (\text{dispersing agent mass/copper oxide mass}) \leq 0.30 \quad (2).$$

2. The dispersing element according to claim 1, wherein:
the copper oxide has a particle diameter of 1 nm or more to 50 nm or less;
the phosphorus-containing organic matter is an organic compound having a phosphate group; and
the dispersing element further comprises copper particles having particle diameters of 0.1 μm or more to 100 μm or less and having shapes extending in one direction, dendritic shapes, or flat shapes.

3. The dispersing element according to claim 2, comprising at least the copper particles having the dendritic shapes.

4. The dispersing element according to claim 2, wherein the copper particles have a mass ratio to a mass of the copper oxide of 1.0 or more to 7.0 or less.

5. The dispersing element according to claim 1 or claim 2, comprising a reductant, the reductant containing at least one kind selected from the group consisting of a hydrazine, a hydrazine hydrate, a sodium, a carbon, a potassium iodide, an oxalic acid, an iron sulfide (II), a sodium thiosulfate, an ascorbic acid, a tin chloride (II), a diisobutylaluminium hydride, a formic acid, a sodium borohydride, and a sulfite.

6. The dispersing element according to claim 1 or claim 2, further comprising a dispersion medium, the dispersion medium being at least one kind selected from the group consisting of a terpineol, a γ-butyrolactone, a cyclohexanone, an ethanol, a propylene glycol, a butanol, a propanol, an ethylene glycol monoethyl ether acetate, and a tetralin.

7. The dispersing element according to claim 1 or claim 2, further comprising a dispersion medium, two or more kinds of the dispersion mediums being contained.

8. A method for manufacturing a structure with a conductive pattern comprising:
a step of applying the dispersing element according to claim 1 or claim 2 over a board in a desired pattern to form an application film; and
a step of performing a firing process on the application film to form a conductive pattern on the board.

9. The method for manufacturing the structure with the conductive pattern according to claim 8, wherein the firing process is performed by generating plasma under an atmosphere containing a reducing gas.

10. The method for manufacturing the structure with the conductive pattern according to claim 8, wherein the firing process is performed by a light irradiation method.

11. The method for manufacturing the structure with the conductive pattern according to claim 8, wherein the firing process is performed by heating the application film with heat at 100° C. or more.

12. The method for manufacturing the structure with the conductive pattern according to claim 8, wherein the dispersing element is applied by an aerosol method to form the desired pattern.

13. The method for manufacturing the structure with the conductive pattern according to claim 8, wherein the dispersing element is applied by screen-printing.

14. The method for manufacturing the structure with the conductive pattern according to claim 8, comprising:
a step of applying the dispersing element over a transfer body and then contacting a convex portion with the transfer body and removing an unnecessary dispersing element to form a desired pattern on a surface of the transfer body; and
a step of contacting the board with the surface of the transfer body to transfer the desired pattern to the board.

15. The dispersing element according to claim 1 or 2, wherein a number average molecular weight of the dispersing agent is 1000 or more to 10000 or less.

16. The dispersing element according to claim 1 or 2, wherein
the reductant comprises at least one selected from the group consisting of hydrazine, hydrazine hydrate, sodium, carbon, potassium iodide, oxalic acid, iron sulfide (II), sodium thiosulfate, ascorbic acid, tin chloride (II), diisobutylaluminum hydride, formic acid, sodium borohydride, and a sulfite, and
a content of the reductant is in a range of a following formula:

$$0.0001 \leq (\text{reductant mass/copper oxide mass}) \leq 0.015.$$

17. The dispersing element according to claim 1, comprising copper particles, the copper particles having shapes extending in one direction, dendritic shapes, or flat shapes.

18. The dispersing element according to claim 1, wherein the copper oxide has a particle diameter of 1 nm or more to 50 nm or less.

* * * * *